US009281392B2

(12) United States Patent
Weyers et al.

(10) Patent No.: US 9,281,392 B2
(45) Date of Patent: Mar. 8, 2016

(54) CHARGE COMPENSATION STRUCTURE AND MANUFACTURING THEREFOR

(71) Applicant: Infineon Technologies Austria AG, Villach (AT)

(72) Inventors: Joachim Weyers, Hoehenkirchen (DE); Armin Willmeroth, Augsburg (DE)

(73) Assignee: Infineon Technologies Austria AG, Villach (AT)

( * ) Notice: Subject to any disclaimer, the term of this patent is extended or adjusted under 35 U.S.C. 154(b) by 43 days.

(21) Appl. No.: 14/316,987

(22) Filed: Jun. 27, 2014

(65) Prior Publication Data

US 2015/0380542 A1    Dec. 31, 2015

(51) Int. Cl.
*H01L 29/78*    (2006.01)
*H01L 29/66*    (2006.01)
(Continued)

(52) U.S. Cl.
CPC ........ *H01L 29/7811* (2013.01); *H01L 29/0615* (2013.01); *H01L 29/0634* (2013.01); *H01L 29/0646* (2013.01); *H01L 29/0696* (2013.01); (Continued)

(58) Field of Classification Search
CPC ............ H01L 29/0634; H01L 29/7802; H01L 29/1095; H01L 29/7813; H01L 29/66712; H01L 29/0696; H01L 29/407; H01L 29/7395; H01L 29/7816; H01L 29/66666; H01L 29/7811; H01L 29/0646; H01L 29/66068
See application file for complete search history.

(56) References Cited

U.S. PATENT DOCUMENTS 6,724,042 B2 *  4/2004  Onishi ................ H01L 29/0634
257/339

6,936,892 B2 *  8/2005  Fujihira .............. H01L 29/0619
257/339

(Continued)

FOREIGN PATENT DOCUMENTS

DE            10066053 B4    3/2006

*Primary Examiner* — Bac Au
(74) *Attorney, Agent, or Firm* — Murphy, Bilak & Homiller, PLLC

(57) ABSTRACT

A charge-compensation semiconductor device includes a semiconductor body including a first surface, a second surface arranged opposite to the first surface, an edge delimiting the semiconductor body in a horizontal direction substantially parallel to the first surface, a drain region of a of a first conductivity type extending to the second surface, an active area, and a peripheral area arranged between the active area and the edge, a source metallization arranged on the first surface, and a drain metallization arranged on the drain region and in Ohmic contact with the drain region. In a vertical cross-section substantially orthogonal to the first surface the charge-compensation semiconductor device further includes: an equipotential region in Ohmic contact with the drain metallization and arranged in the peripheral area and next to the first surface, a low-doped semiconductor region arranged in the peripheral area and having a first concentration of dopants, and a plurality of first pillar regions alternating with second pillar regions in the active area and the peripheral area. The first pillar regions having a second concentration of dopants of the first conductivity type higher than the first concentration and are in Ohmic contact with the drain region. The second pillar regions are of a second conductivity type and in Ohmic contact with the source metallization. At least one of an outermost of the first pillar regions and an outermost of the second pillar regions forms an interface with the low-doped semiconductor region. A horizontal distance between the interface and the equipotential region divided by a vertical distance between the first surface and the drain region is in a range from about 0.5 to about 3.

20 Claims, 15 Drawing Sheets

(51) Int. Cl.
*H01L 29/06* (2006.01)
*H01L 29/10* (2006.01)
*H01L 29/739* (2006.01)
*H01L 29/40* (2006.01)

(52) U.S. Cl.
CPC .......... *H01L 29/1095* (2013.01); *H01L 29/407* (2013.01); *H01L 29/66068* (2013.01); *H01L 29/66712* (2013.01); *H01L 29/7395* (2013.01); *H01L 29/7802* (2013.01); *H01L 29/7813* (2013.01); *H01L 29/7816* (2013.01)

(56) References Cited

U.S. PATENT DOCUMENTS

| | | |
|---|---|---|
| 7,002,205 B2 | 2/2006 | Onishi et al. |
| 7,042,046 B2 | 5/2006 | Onishi et al. |
| 7,161,209 B2 | 1/2007 | Saito et al. |
| 7,622,771 B2 | 11/2009 | Ono et al. |
| 7,737,469 B2 | 6/2010 | Saito et al. |
| 7,875,951 B2* | 1/2011 | Rieger ................ H01L 29/0623 257/330 |
| 9,147,763 B2* | 9/2015 | Weber ................ H01L 29/7804 |
| 2005/0045922 A1* | 3/2005 | Ahlers ................ H01L 27/0883 257/242 |
| 2005/0077572 A1 | 4/2005 | Yamauchi et al. |
| 2005/0082591 A1* | 4/2005 | Hirler ................ H01L 29/0619 257/302 |
| 2007/0138543 A1 | 6/2007 | Saito |
| 2007/0138544 A1* | 6/2007 | Hirler ................ H01L 29/407 257/330 |
| 2007/0272979 A1 | 11/2007 | Saito et al. |
| 2008/0315297 A1 | 12/2008 | Takashita et al. |
| 2009/0267174 A1* | 10/2009 | Willmeroth ........ H01L 29/0634 257/493 |
| 2010/0078775 A1* | 4/2010 | Mauder ................ H01L 29/0615 257/655 |
| 2010/0163972 A1 | 7/2010 | Saggio et al. |
| 2011/0204442 A1 | 8/2011 | Guan et al. |

* cited by examiner

CHARGE COMPENSATION STRUCTURE AND MANUFACTURING THEREFOR

TECHNICAL FIELD

Embodiments of the present invention relate to field-effect semiconductor devices having a charge compensation structure and manufacturing methods therefor, in particular to power semiconductor devices having in an active area a charge compensation structure.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$, high robustness and/or good softness are often desired.

To achieve low on-state resistance Ron and high breakdown voltages $U_{bd}$, compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge compensation structure remain "cool" compared with conventional semiconductor power devices.

Meanwhile, switching losses of power semiconductor devices have become more important. Depending on device operation, output charge $Q_{OSS}$ (or output capacitance $C_{OSS}$) and switching losses $E_{OSS}$, respectively, stored in the space charge region formed in the off-state and during reverse bias, respectively, mainly determine the switching losses. The stored charge $Q_{OSS}$ of semiconductor devices with charge compensation structures may be comparatively high. This may result in significant switching losses $E_{OSS}$ when significant parts of the stored charge $Q_{oss}$ are removed at high voltages across load terminals of the power semiconductor device. In addition, the output charge $Q_{OSS}$ has to be removed to enable blocking. This results in switching delays and/or increased losses.

To achieve high breakdown voltages $U_{bd}$, an edge-termination structure may be used in a peripheral area surrounding the active area with active MOSFET-cells. However, the peripheral area requires chip area and thus increases costs. Further, the edge-termination structure and the peripheral area, respectively, may substantially contribute to the output charge $Q_{OSS}$ and the output capacitance $C_{OSS}$, respectively. The switching losses may even be dominated by the peripheral area.

Accordingly, there is a need to improve semiconductor devices with charge compensation structures and manufacturing of those semiconductor devices.

SUMMARY

According to an embodiment of a charge-compensation semiconductor device, the charge-compensation semiconductor device has a rated breakdown voltage and includes a semiconductor body having a first surface, an edge delimiting the semiconductor body in a horizontal direction substantially parallel to the first surface, an active area, and a peripheral area arranged between the active area and the edge. A source metallization is arranged on the first surface. A drain metallization is arranged opposite to the source metallization. In a vertical cross-section substantially orthogonal to the first surface the semiconductor body further includes an intrinsic semiconductor region arranged in the peripheral area, and a plurality of first pillar regions alternating with second pillar regions in the active area and the peripheral area. The first pillar regions have a higher doping concentration than the intrinsic semiconductor region and are in Ohmic contact with the drain metallization. The second pillar regions of the active area are in Ohmic contact with the source metallization via respective body regions having a higher doping concentration than the second pillar regions. At least a majority of the second pillar regions of the peripheral area adjoining a connecting region which is of the same conductivity type as the second pillar regions and has a lower doping concentration than an adjoining outermost of the body regions. Between adjacent first pillar regions and second pillar regions a respective pn-junction is formed. At least one of an outermost of the first pillar regions and an outermost of the second pillar regions forms an interface with the intrinsic semiconductor region at a horizontal position where a voltage at the first surface is at least about a fifth of the rated breakdown voltage when the rated breakdown voltage is applied between the source metallization and the drain metallization.

According to an embodiment of a charge-compensation semiconductor device, the charge-compensation semiconductor device includes a semiconductor body including a first surface, a second surface arranged opposite to the first surface, an edge delimiting the semiconductor body in a horizontal direction substantially parallel to the first surface, a drain region of a of a first conductivity type extending to the second surface, an active area, and a peripheral area arranged between the active area and the edge, a source metallization arranged on the first surface, and a drain metallization arranged on the drain region and in Ohmic contact with the drain region. In a vertical cross-section substantially orthogonal to the first surface the charge-compensation semiconductor device further includes: an equipotential region in Ohmic contact with the drain metallization and arranged in the peripheral area and next to the first surface, a low-doped semiconductor region arranged in the peripheral area and having a first concentration of dopants, and a plurality of first pillar regions alternating with second pillar regions in the active area and the peripheral area. The first pillar regions having a second concentration of dopants of the first conductivity type higher than the first concentration and are in Ohmic contact with the drain region. The second pillar regions are of a second conductivity type and in Ohmic contact with the source metallization. At least one of an outermost of the first pillar regions and an outermost of the second pillar regions forms an interface with the low-doped semiconductor region. A horizontal distance between the interface and the equipotential region divided by a vertical distance between the first surface and the drain region is in a range from about 0.5 to about 3.

According to an embodiment of a method for manufacturing charge-compensation semiconductor device, the method includes providing a semiconductor body, including a first surface a second surface arranged opposite to the first surface, a drain region of a first conductivity type extending to the second surface, an active area, and a peripheral area surrounding the active area. In a vertical cross-section substantially orthogonal to the first surface the semiconductor body further includes a low-doped semiconductor region having a first concentration of dopants and arranged in the peripheral area, a plurality of first pillar regions alternating with second pillar regions in the active area and the peripheral area. The first pillar regions have a second concentration of dopants of a first conductivity type higher than the first concentration. Between adjoining first pillar regions and second pillar regions a respective pn-junction is formed. At least one of an outermost of the first pillar regions and an outermost of the second pillar regions form an interface with the low-doped semiconductor region. A connecting region of the second conductivity type is arranged in the peripheral area and adjoins at least a majority of the second pillar regions of the peripheral area. The method further includes forming in the peripheral area an equipotential structure at least next to the first surface, forming a source metallization on the first surface in Ohmic contact with the second pillar regions of the active area and with the connecting region, forming a drain metallization opposite to the source metallization and in Ohmic contact with the equipotential structure and the first pillar regions, and cutting the semiconductor body to form an edge extending between the first surface and the second surface and surrounding the active area. The method is formed such that a horizontal distance between the interface and the equipotential structure divided by a vertical distance between the first surface and the drain region in a range from about 0.5 to about 3.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
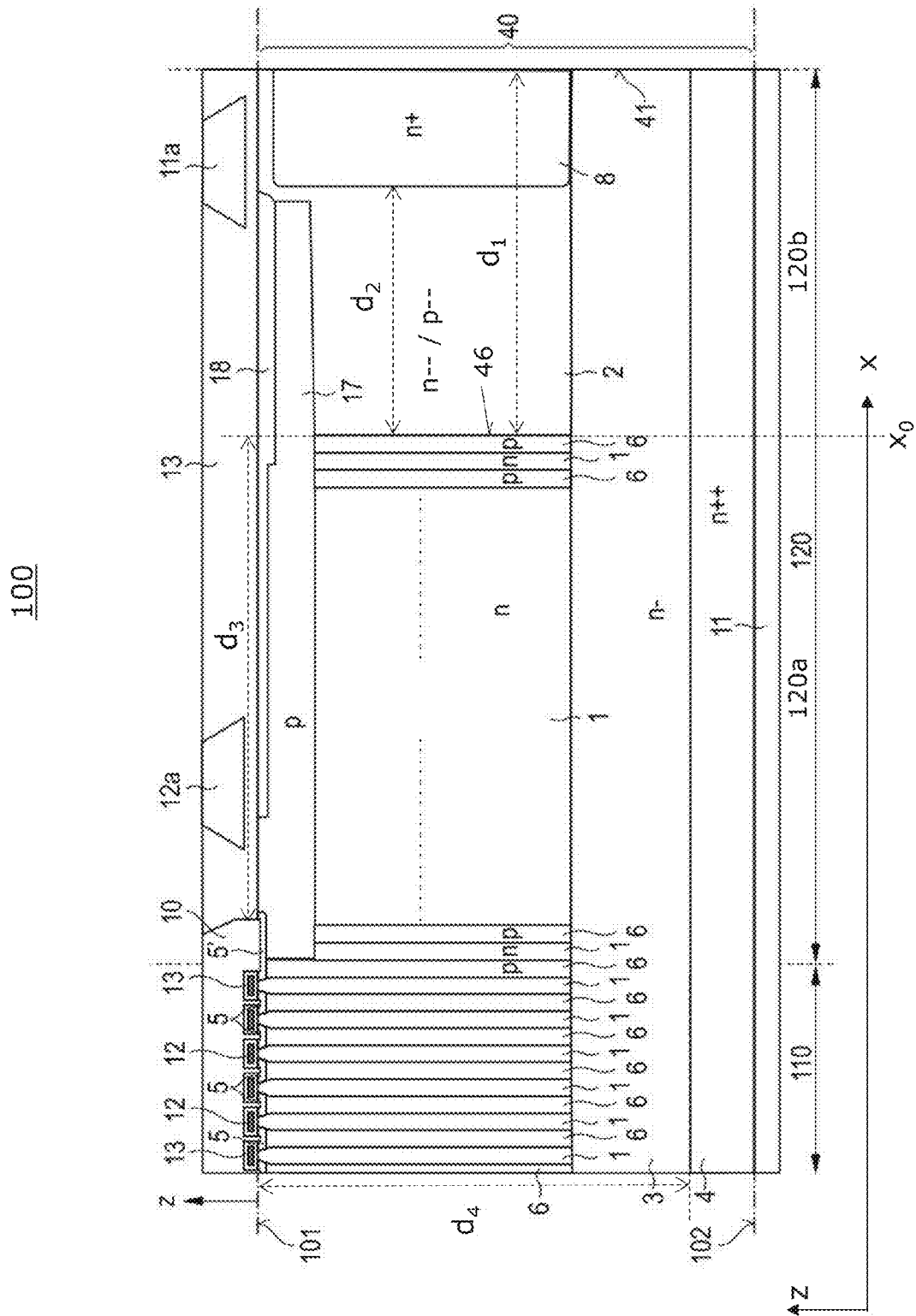
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a source metallization and an insulated gate electrode arranged on the first surface and a drain metallization arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V. Within this specification the terms "power semiconductor device" and "power semiconductor component" are used synonymously.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are in low Ohmic contact with a drain electrode (drain metallization). The source region is in low Ohmic contact with a source electrode (source metallization). In the context of the present specification, the term "in Ohmic contact" intends to describe that there is a low-ohmic ohmic current path between respective elements or portions of a semiconductor device when no voltages or only small probe voltages are applied to and/or across the semiconductor device. Within this specification the terms "in Ohmic contact", "in resistive electric contact", "electrically coupled", and "in resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e.g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region (n-conducting semiconductor region).

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from a conducting direction in which a pn-load junction, for example the pn-junction between the body region and the drift region of a MOSFET, is forwardly biased to the opposite direction or blocking direction in which the pn-load junction is reversely biased. The term "hard commutating" as used in this specification intends to describe commutating with a speed of at least about $10^9$ V/s, more typically with a speed of at least about $5*10^9$ V/s.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of a charge-compensation semiconductor device 100 is explained. FIG. 1 illustrates a vertical cross-section through a semiconductor body 40 of the semiconductor device 100. The semiconductor body 40 extends between a first surface 101, facing a vertical direction z, and a second surface 102 arranged opposite to the first surface 101. In a horizontal direction x that is substantially parallel to the first surface 101, the semiconductor body 40 is delimited by an edge 41, for example a sawing edge, which is substantially orthogonal to the first surface 101. The semiconductor body 40 has an active area 110 and a peripheral area 120 arranged between the active area 110 and the edge 41. Typically, the peripheral area 120 surrounds the active area 110 when seen from above.

A source metallization 10 is arranged on the first surface 101. A drain metallization 11 is arranged on the second surface 102, i.e. opposite to the source metallization 10. Furthermore, a plurality of gate electrodes 12 is typically also arranged on the first surface 101 in the active area and insulated from the source metallization 10 and the semiconductor body 40 by a dielectric region 13. The gate electrodes 12 are connected to a gate metallization that is not shown in FIG. 1. Accordingly, the semiconductor device 100 may be operated as a three-terminal device.

The semiconductor body 40 typically includes a bulk mono-crystalline material 4 and at least one epitaxial layer 3, 2, 1 formed thereon. Using the epitaxial layer(s) 3, 2, 1 provides more freedom in tailoring the background doping of the material since the doping concentration can be adjusted during deposition of the epitaxial layer or layers.

In the exemplary embodiment illustrated in FIG. 1, the semiconductor body 40 includes a highly doped n-type drain region 4 that extends to the second surface 102 and is in Ohmic contact with the drain metallization 11 and with an n-type field-stop region 3 that adjoins the drain region 4 and has a lower maximum doping concentration than the drain region 4. The drain region 4 and the optional field-stop region 3 are typically arranged in the active area 110 and the peripheral area 120 and may extend to the edge 41.

A plurality of alternating n-type drift portions 1 and p-type compensation regions 6 forming respective pn-junctions with each other are arranged in the active area 110 and in adjoining part of the peripheral area 120. The drift portions 1 have a first maximum doping concentration, which is typically higher than the maximum doping concentration of the field-stop region 3. The drift portions 1 are in Ohmic contact with the drain metallization 11 (in the exemplary embodiment via the adjoining field-stop region 3 and the drain region 4), and typically extend in the active area 110 to the first surface 101. For sake of clarity, only a few drift portions 1 and compensation regions 6 are illustrated in FIG. 1. As indicated by the two dotted lines in FIG. 1, a plurality of drift portions 1 and the compensation regions 6 may be arranged in the peripheral area 120. The drift portions 1 and the compensation regions 6 of the peripheral area are typically spaced apart from the first surface 101. In the following, the n-type drift portions 1 are also referred to as n-type pillar regions 1 and first pillar regions 1 (of the first conductivity type), respectively, and the p-type compensation regions 6 are also referred to as p-type pillar regions 6 and second pillar regions 6 (of the second conductivity type), respectively.

An (mathematically) integrated dopant concentration of the drift portions 1 substantially matches an integrated dopant concentration of the compensation regions 6 at least in the active area 110. Accordingly, the drift portions 1 and the compensation regions 6 form a pn-compensation structure 1, 6. The mean dopant concentration of the drift portions 1 and compensation regions 6, i.e., the mathematically integrated difference of the donor concentration and the acceptor concentration per volume, is typically lower than the maximum doping concentration of the field-stop region 3, more typically lower than the mean doping concentration of the field-stop region 3. Even more typically, the the mean dopant concentration of the drift portions 1 and compensation regions 6 is below 10% or below 5% of the maximum dopant concentration of the drift portions 1 and/or the compensation regions 6. Even more typically, the mean dopant concentration of the drift portions 1 and compensation regions 6 is substantially zero.

In the exemplary embodiment, the p-type compensation regions 6 are formed as vertically orientated pillars. Alternatively, the p-type compensation regions 6 are formed as substantially vertically orientated strip-type parallelepipeds, rectangles or ellipsoids.

Depending on the manufacturing of the pn-compensation structure 1, 6, the dopant concentration may vary in the drift portions 1 and/or compensation regions 6.

The compensation regions 6 of the active area 110 are in Ohmic contact with the source metallization 10 via body regions 5, 5'.

Figure 2:
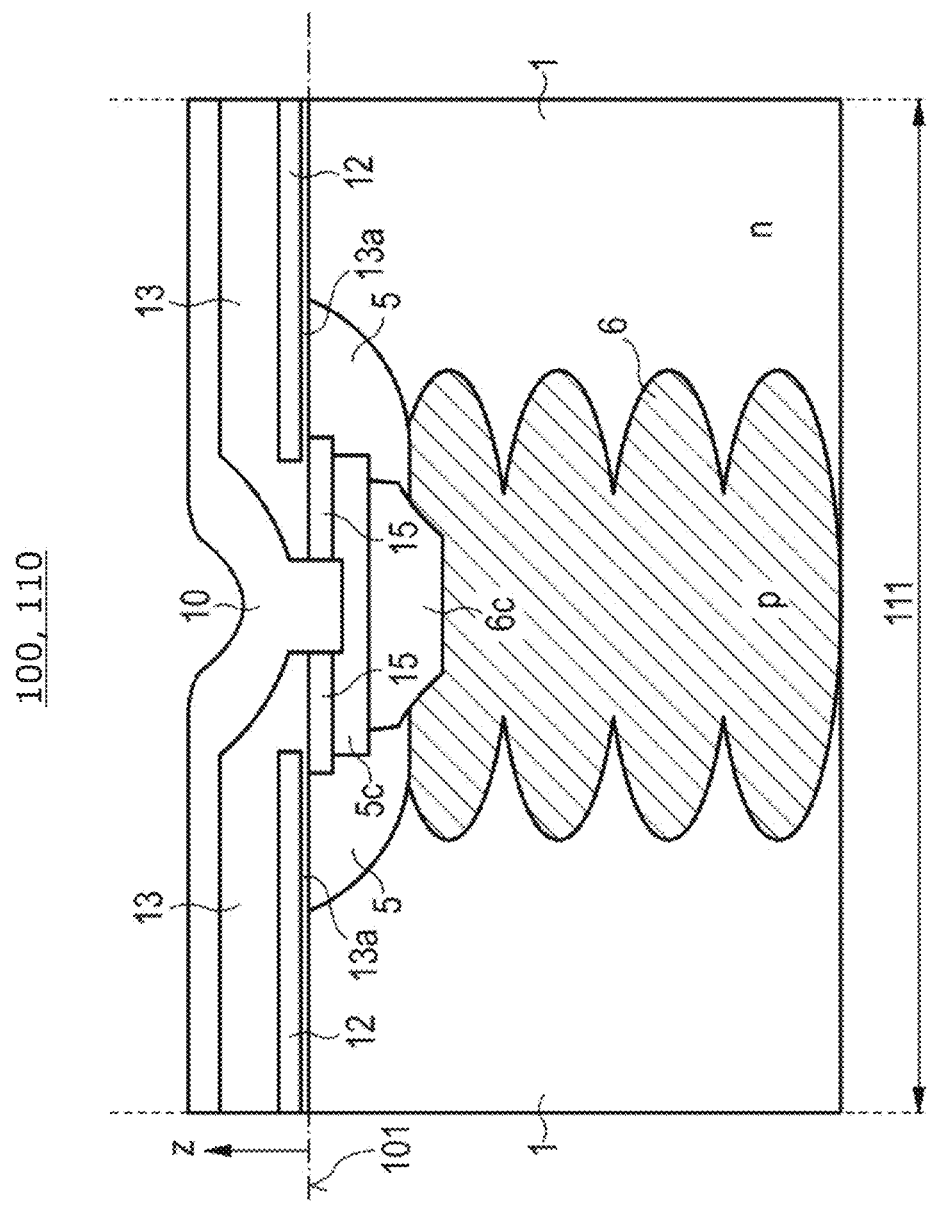
FIG. 2 illustrates a section of the vertical cross-section through the semiconductor device illustrated in FIG. 1 according to an embodiment.

This is explained in more detail with regard to FIG. 2 illustrating an enlarged upper section of the semiconductor device 100 illustrated in FIG. 1. The illustrated section of FIG. 2 typically corresponds to an upper part of one of a plurality of unit cells 111 in the active area 110 of the semiconductor device 100.

In the exemplary embodiment, a $p^+$-type body contact region $5c$ and two $n^+$-type source regions 15 are formed in a p-type body region 5. Further, an optional $p^+$-type contact region $6c$ extends between the body contact region $5c$ and the compensation region 6. The body contact region(s) $5c$ and the contact region(s) $6c$ are not shown in FIG. 1 and the following Figures for sake of clarity.

A portion $13a$ of the dielectric region 13 is arranged between the first surface 101 and each of the gate electrodes 12, and extends in a horizontal direction from the drift portion 1 along the body region 5 at least to the source region 15 so that an inversion channel, which is also referred to herein as MOS-channel, may be formed by the field-effect in a channel region of the body region 5 along the portion(s) $13a$ forming a gate dielectric region. Accordingly, the semiconductor device 100 may be operated as a MOSFET.

The remaining portion of the dielectric region 13 forms an interlayer dielectric between the source metallization 10 and gate electrode 12 and first surface 101, respectively.

In the exemplary embodiment, the source metallization 10 is electrically contacted with the source regions 15 and the body contact region $5c$ via a shallow trench contact formed through the interlayer dielectric 13 and into the semiconductor body 40. In other embodiments, the source metallization 10 electrically contacts the source region 15 and the body contact region $5c$ substantially at the first surface 101.

According to another embodiment, the gate electrode(s) 12 and gate dielectric(s) $13a$ are formed in a respective trench extending from the first surface 101 into the semiconductor body 40. In this embodiment, the body region 5 and source regions 15 adjoin an upper part of the respective trench while the drift portions 1 adjoin a lower part of the respective trench. In this embodiment, the drift portions 1 may not extend to the first surface 101 in the active area 110. Referring again to FIG. 1, further embodiments are explained.

According to an embodiment, the doping concentrations of the p-type compensation regions 6 and the drift portions 1 are chosen such that, in the off-state, their charges can be mutually depleted and that, in the on-state, an uninterrupted, low-resistive conduction path is formed from the source metallization 10 to the drain metallization 11.

The active area 110 may be defined by the presence of source regions 15 and insulated gate electrodes 12 configured to form and/or change a channel region in an adjacent the body region 5. The active area 110 may also be defined by the presence of active cells, typically MOSFET-cells, for carrying a load current between the source metallization 10 and the drain metallization 11.

As illustrated in FIG. 1, the interlayer dielectric 13 typically also covers the semiconductor body 40 in the peripheral area 120. The interlayer dielectric 13 may substantially extend to the edge 41.

According to an embodiment, the semiconductor body 40 further includes in the peripheral area 120 a low-doped semiconductor region 2, which is in Ohmic contact with the drift portions 1.

The low-doped semiconductor region 2 may be slightly p-doped or a slightly n-doped semiconductor region. Using a low-doped semiconductor region 2 in the peripheral area 120 typically reduces the switching losses.

Typically, the low-doped semiconductor region 2 has a maximum doping concentration of less than about $10^{15}$ cm$^{-3}$ or even less than about $10^{14}$ cm$^{-3}$. More typically, the low-doped semiconductor region 2 is an intrinsic semiconductor region. Typically, the doping concentration of the first and second pillar regions is at least about ten times the maximum doping concentration of the low-doped semiconductor region 2.

If not specified, the term doping concentration of a semiconductor region or semiconductor layer when used in comparison with a doping concentration of another semiconductor region or semiconductor may also refer to a maximum concentration and/or a mean or average concentration of dopants of the respective semiconductor region or semiconductor layer. Within the semiconductor region or semiconductor layer, the doping concentration may vary.

The doping concentration of the low-doped semiconductor region 2 is typically lower than the doping concentration of the drift portions 1 (and the compensation regions 6) by at least a factor of five, more typically by at least a factor of about ten, even more typically by a factor of at least about 20, even more typically by a factor of at least about 50, for example by a factor of about 100.

Further, the doping concentration the low-doped semiconductor region 2 typically depends on the voltage class of the semiconductor device. For example, the maximum doping concentration of donors of an $n^-$-type low-doped semiconductor region 2 may be in a range from about $2*10^{13}$ cm$^{-3}$ to about $2*10^{14}$ cm$^{-3}$ for a semiconductor device 100 with rated blocking voltage of 600 V.

The maximum doping concentration (of donors) of the low-doped semiconductor region 2 may substantially correspond to the average doping concentration (of donors) of the low-doped semiconductor region 2 and is typically lower than about $10^{15}$ cm$^{-3}$, more typically lower than about $5*10^{14}$ cm$^{-3}$ or even lower than about $10^{14}$ cm$^{-3}$, i.e. the low-doped semiconductor region 2 may be a substantially intrinsic semiconductor region with a doping concentration in a range from about $10^{13}$ cm$^{-3}$ to about $10^{14}$ cm$^{-3}$.

Further, the low-doped semiconductor region 2 is typically only arranged in the peripheral area 120 and may extend to the first surface 101 in the peripheral area 120.

In the exemplary embodiment, the p-type pillar regions 6 (compensation regions) of the peripheral area 120 adjoin a p-type connecting region 17 which is in Ohmic contact with the source metallization 10 via an outermost of the body regions 5'.

The connecting region 17 is typically a depletable semiconductor region, i.e. a semiconductor regions which is already substantially depleted when in an off-state a reverse voltage is applied between the drain metallization 11 and the source metallization 10 reversely biasing the pn-junctions formed between adjoining n-type pillar regions and p-type pillar region 6 which is lower than the rated breakdown voltage of the semiconductor device 100. Due to using a depletable connecting region 17 or at least a partly depletable connecting region 17, a major part of the peripheral area 120 next to the first surface source 101 potential differs from the source potential at higher reverse voltage. Thus a reduction of the breakdown voltage may be avoided. The doping concentration of the connecting region 17 is typically chosen such that the connecting region 17 is substantially depleted only above high enough reverse voltage of e.g. at least about a fifth or half of the rated breakdown voltage is applied between the source metallization 10 and the drain metallization 11.

In the exemplary embodiment illustrated in FIG. 1, the first and second pillar regions 1, 6 of the peripheral area 120 substantially extends into the same depth as the first and second pillar regions 1, 6 in the active area 110.

According to an embodiment, an outermost of the p-type pillar regions 6 of the peripheral area 120, i.e. the p-type pillar regions 6 of the peripheral area 120 which is closest to the edge 41, forms an interface 46 with the low-doped semiconductor region 2 at a horizontal position x0 where a voltage at the first surface 101 is at least about a fifth of the rated breakdown voltage when the rated breakdown voltage is applied between the source metallization 10 and the drain metallization 11.

The interface 46 may be formed as a pn-junction between the outermost p-type pillar region 6 and an n-type low-doped semiconductor region 2 or between an outermost n-type pillar region 1 and a p-type low-doped semiconductor region 2.

Alternatively, the interface 46 may be formed as a junction between an outermost pillar region 1, 6 and a lower-doped low-doped semiconductor region 2 of the same conductivity type.

In the context of the present specification, the term "junction" intends to describe the boundary surface between adjoining semiconductor regions, i.e. semiconductor regions in direct mechanical contact, or adjoining semiconductor portions of the same conductivity type but having significantly different doping concentrations.

In the context of the present specification, the term "pn-junction" as used in this specification intends to describe the boundary surface between adjoining semiconductor regions or semiconductor portions of different conductivity type.

Typically, the interface 46 is formed at a horizontal position x0 where the voltage at the first surface 101 is at least about a third, even more typically at least about a half of the rated breakdown voltage when the rated breakdown voltage is applied between the source metallization 10 and the drain metallization 11.

Numerical simulation shows that the switching losses of the peripheral area 120 semiconductor device 100 can be reduced by up to about a factor 10 compared to a similar structure but without alternating n-type and p-type pillar regions 1, 6 in the peripheral area or with alternating n-type and p-type pillar regions 1, 6 in the peripheral area which extend closer to the edge and semiconductor regions at the edge which are substantially on drain potential when the rated breakdown voltage is applied between the source metallization 10 and the drain metallization 11 without substantially reducing the breakdown voltage. This is because the low-doped semiconductor region 2 (intrinsic semiconductor region 2) is situated in a region of the peripheral area 120 where the electric field during the blocking mode (reverse bias) is low enough so that the symmetry breaking of the semiconductor structure, which is due the transition from the compensation structure 1, 6 to the low-doped semiconductor region 2 and the edge 41, respectively, does not or almost not result in a reduction of the rated breakdown voltage.

It was found that a chip design with a horizontal distance d1 between the edge 41 and the interface 46 divided by a horizontal distance d3 between the source metallization 10 and the interface 46 is in a range from about 0.1 to about 0.9, more typically in a range from about 0.2 to about 0.5 results in particularly low switching losses at given rated breakdown voltage.

As illustrated in FIG. 1, the peripheral area 120 typically includes an inner portion 120a with alternating n-type and p-type pillar regions 1, 6, and an outer portion 120b without pillar regions 1, 6.

In the exemplary embodiment, a highly doped field-stopper region 8 in Ohmic contact with the drain metallization 11 and forming an equipotential region is arranged in the peripheral area 120 (outer portion 120b) and between the low-doped semiconductor region 2 and the edge 41.

The field-stopper region 8 may also extend to the first surface 101 and/or to the drain region 4. In embodiments in which the field-stopper region 8 is of the same conductivity type as the low-doped semiconductor region 2 (n-type in the exemplary embodiment illustrated in FIG. 1), the field-stopper region 8 may also be spaced apart from the field-stop region 3 by a lower portion of the low-doped semiconductor region 2.

As illustrated in FIG. 1, the connecting region 17 typically extends close to the field-stopper region 8.

Due to the field-stopper region 8, the electric field in the off-state does not, or at least almost does not, extend to the edge 41. Accordingly, a low leakage current is ensured, as crystal defects which may be caused by sawing are shielded by the highly doped field-stopper region 8.

It was further found that a chip design with a horizontal distance d2 between the interface 46 and the equipotential region 8 divided by a vertical distance d4 between the first surface 101 and the drain region 4 in a range from about 0.5 to about 3, more typically from about 0.8 to about 1.5 results in particularly low switching losses at given rated breakdown voltage.

The equipotential region may also be formed by and/or include a field plate 11a which is arranged on the first surface 101, spaced apart from the semiconductor body 40 by the dielectric region 13 and in Ohmic contact with the drain metallization 11 and the drain region 4. The field plate 11a maybe in Ohmic contact with the drain metallization 11 via the field-stopper region 8 and conductive plug (not shown in FIG. 1), e.g. a poly-silicon plug, extending through the dielectric region 13.

Typically, the semiconductor body 40 of semiconductor device 100 further includes in the peripheral area 120 an n-type depletable semiconductor region 18 (second depletable semiconductor region) arranged between the connecting region 17 (first depletable semiconductor region) and the first surface 101 and forming a pn-junction with the connecting region 17. The second depletable semiconductor region 18 has typically a maximum doping concentration higher than the maximum doping concentration of the low-doped semiconductor region 2. Typically, a vertically integrated dopant concentration of the second depletable semiconductor region 18 matches or is lower than a vertically integrated dopant concentration of the connecting region 17. The second depletable semiconductor region 18 typically stabilizes the edge-termination structure against surface charges on the first surface 101 and reduces the injection of holes into the dielectric region 13.

The doping concentration of the second depletable semiconductor region 18 may be constant or decreasing continuously or in discrete steps with decreasing distance from the edge 41 and the field-stopper region 8, respectively. The vertical extension of the second depletable semiconductor region 18 may be constant or increasing continuously or in discrete steps with decreasing distance from the edge 41 and the field-stopper region 8, respectively.

Likewise, the doping concentration of the connecting region 17 may be constant or decreasing continuously or in discrete steps with decreasing distance from the edge 41 and the field-stopper region 8, respectively. The vertical extension of the connecting region 17 may be constant or decreasing continuously or in discrete steps with decreasing distance from the edge 41 and the field-stopper region 8, respectively In the exemplary embodiment illustrated in FIG. 1, the semiconductor device 100 further includes a field plate 12a in Ohmic contact with the gate electrodes 12 and a gate metallization (not shown in FIG. 1). Accordingly, the electric field distribution in the off-state (reverse bias) may be further smoothed and/or the sensitivity of the semiconductor device 100 with respect to mobile charges in the dielectric region 13 be further reduced.

The field plate 12a is typically arranged between the field plate 11a and the source metallization 10.

The field plate 11a and/or the field plate 12a may be stepped as, i.e., the vertical (minimum) distance of the field plates 11a and/or 12a from the first surface 101 may change substantially stepwise in horizontal direction x. In other embodiments, only one or even none of the field plate 11a, 12a is arranged on the first surface 101.

Typically, the field plate 11a, the field plate 12a, the field-stopper region 8, and the low-doped semiconductor region 2 are substantially ring-shaped, for example annular when seen from above. In these embodiments, the field plate 11a and the field plate 12a form a drain ring 11a and a gate ring 12a, respectively.

Figure 3:
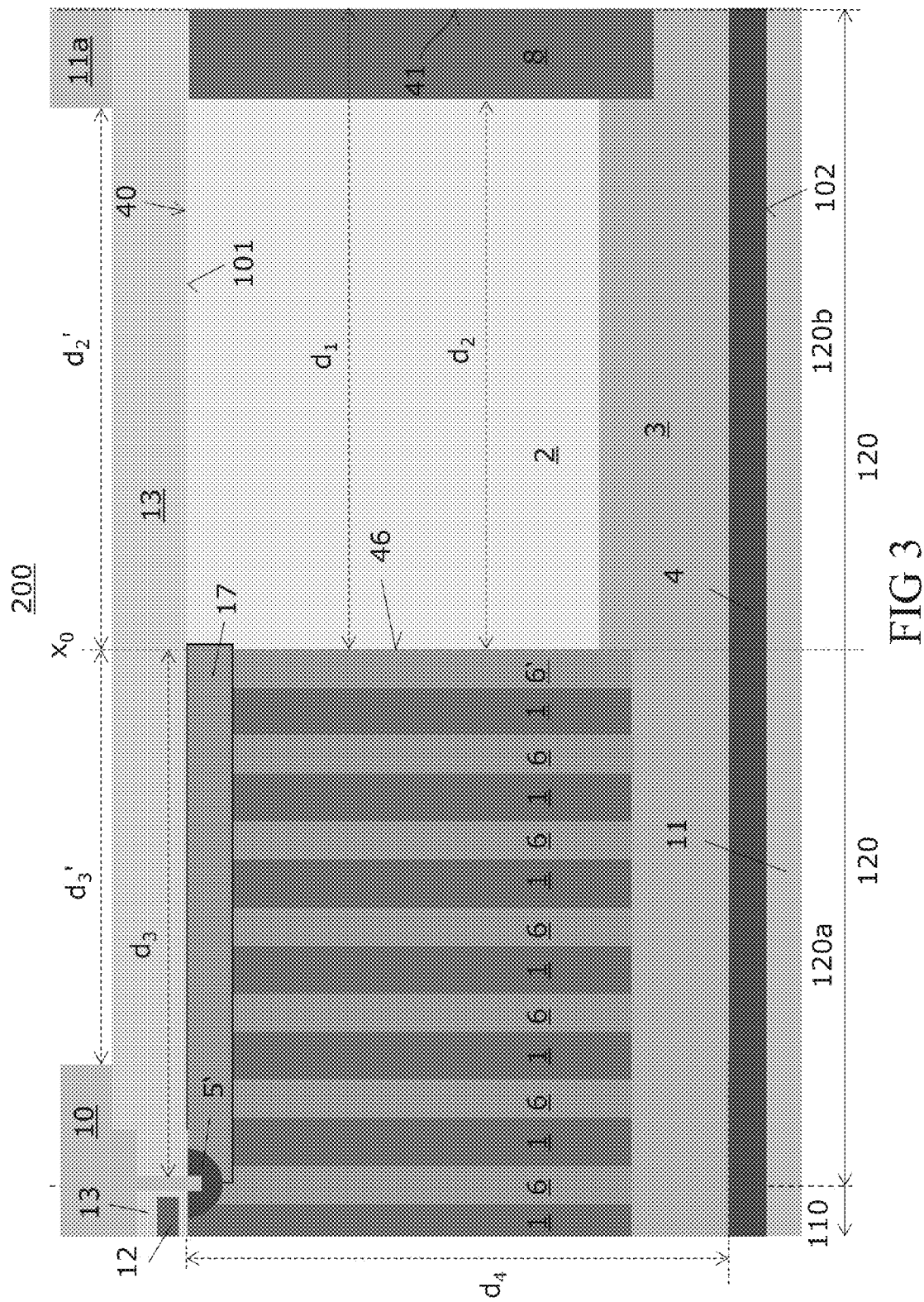
FIG. 3 illustrates a vertical cross-section through a semiconductor body of a semiconductor device according to an embodiment.

FIG. 3 illustrates a vertical cross-section through a semiconductor body 40 of a charge-compensation semiconductor device 200. The semiconductor device 200 is similar to the semiconductor device 100 explained above with regard to FIGS. 1 and 2. The semiconductor body 40 of the semiconductor device 200 also extends between a first horizontal surface 101 and a second surface 102 surface. In a horizontal direction the semiconductor body 40 of the semiconductor device 200 is also delimited by an edge 41 extending between the first and second surfaces 101, 102. A highly doped n-type drain region 8 is arranged at the second surface 102 both in an active area 110 and a peripheral area 120 arranged between the active area and the edge 41. The drain region 8 typically extends to the edge 41. A source metallization 10 is arranged on the first surface 101 and a drain metallization 11 is arranged on the second surface 102 and the drain region 8, and in Ohmic contact with the drain region 8.

In the exemplary embodiment, a low-doped semiconductor region 2, which is typically an intrinsic semiconductor region, and two equipotential regions 8, 11a in Ohmic contact with the drain metallization 11 are arranged in the peripheral area 120 and next to the first surface 101. The equipotential region 11a is formed on the first surface as a field plate 11a and the equipotential region 8 is formed in the semiconductor body 40 as an n-type field-stopper region 8 adjoining the low-doped semiconductor region 2 and having a higher doping concentration than the low-doped semiconductor region 2.

In other embodiments, only one of the equipotential regions 8, 11a may be used.

In the exemplary embodiment, the low-doped semiconductor region 2 and the field-stopper region 8 extend to the first surface 101.

A plurality of n-type first pillar regions 1 alternating with p-type second pillar regions 6, 6' are arranged in the active area 110 and an adjoining portion of the peripheral area 120 between the low-doped semiconductor region 2 and the active area 110. The first pillar regions 1 are in Ohmic contact with the drain region 8 via an n-type field-stop region 3. The second pillar regions 6, 6' of the peripheral area 120 are in Ohmic contact with the source metallization 10 via a p-type depletable semiconductor region 17 and a higher p-doped outermost body region 5' arranged next to an outermost of a plurality of gate electrodes 13 of the active area which are arranged on the first surface an spaced apart from the adjacent body region(s) and the adjacent corresponding first pillar region 1 by a dielectric region 13.

Due to manufacturing, the field-stopper region 8 may extend vertically deeper into the field-stop region 3. For example, the field-stop region 3 may be formed as an n-doped epitaxial layer 3 on a highly n-doped substrate 4. Thereafter, a substantially intrinsic layer 2 may be epitaxially deposited on the epitaxial layer 3. Thereafter, donors and acceptor may be implanted using masks such that more donors are implanted into a zone for the field-stopper region 8 compared to zones for the first pillar regions 1 which are formed after a subsequent thermal annealing. Due to the higher doping of the zone for the field-stopper region 8 compared the zones for the first pillar regions 1, donors of the zone for the field-stopper region may diffuse deeper into the typically lower doped epitaxial layer 3 during the thermal annealing.

In the exemplary embodiment illustrated in FIG. 3, an outermost of the second pillar regions 6' forms an interface 46 with the low-doped semiconductor region 2, wherein a horizontal distance d2, d2' between the interface 46 and the equipotential region 8, 11a divided by a vertical distance d4 between the first surface 101 and the drain region 5 is in a range from about 0.5 to about 3, more typically from about 0.8 to about 1.5. As explained above with regard to FIG. 1, such a chip design results in particularly low switching losses at given rated breakdown voltage.

In embodiments in which both a field plate 11a and a field-stopper region 8 are used as equipotential regions 8, 11a, the horizontal distance d2' between the interface 46 and the field plate 11a is typically smaller than the horizontal distance d2 between the interface 46 and the field-stopper region 8.

In the exemplary embodiment, an outermost portion of the source metallization 10 forms a stepped source field plate. The interface 46 is arranged between the source field plate and drain field plate 11a.

Both the maximum horizontal distance d3 between the source metallization 10 and the interface 46 and the minimum horizontal distance d3' between the source metallization 10 and the interface 46 maybe in a range from about 0.1 to about 0.9, more typically in a range from about 0.2 to about 0.5.

Further, a horizontal distance d1 between the edge 41 and the interface 46 divided by any of the horizontal distance d3, d3' between the source metallization 10 and the interface 46 may be in a range from about 0.1 to about 0.9, more typically in a range from about 0.2 to about 0.5

Figure 4:
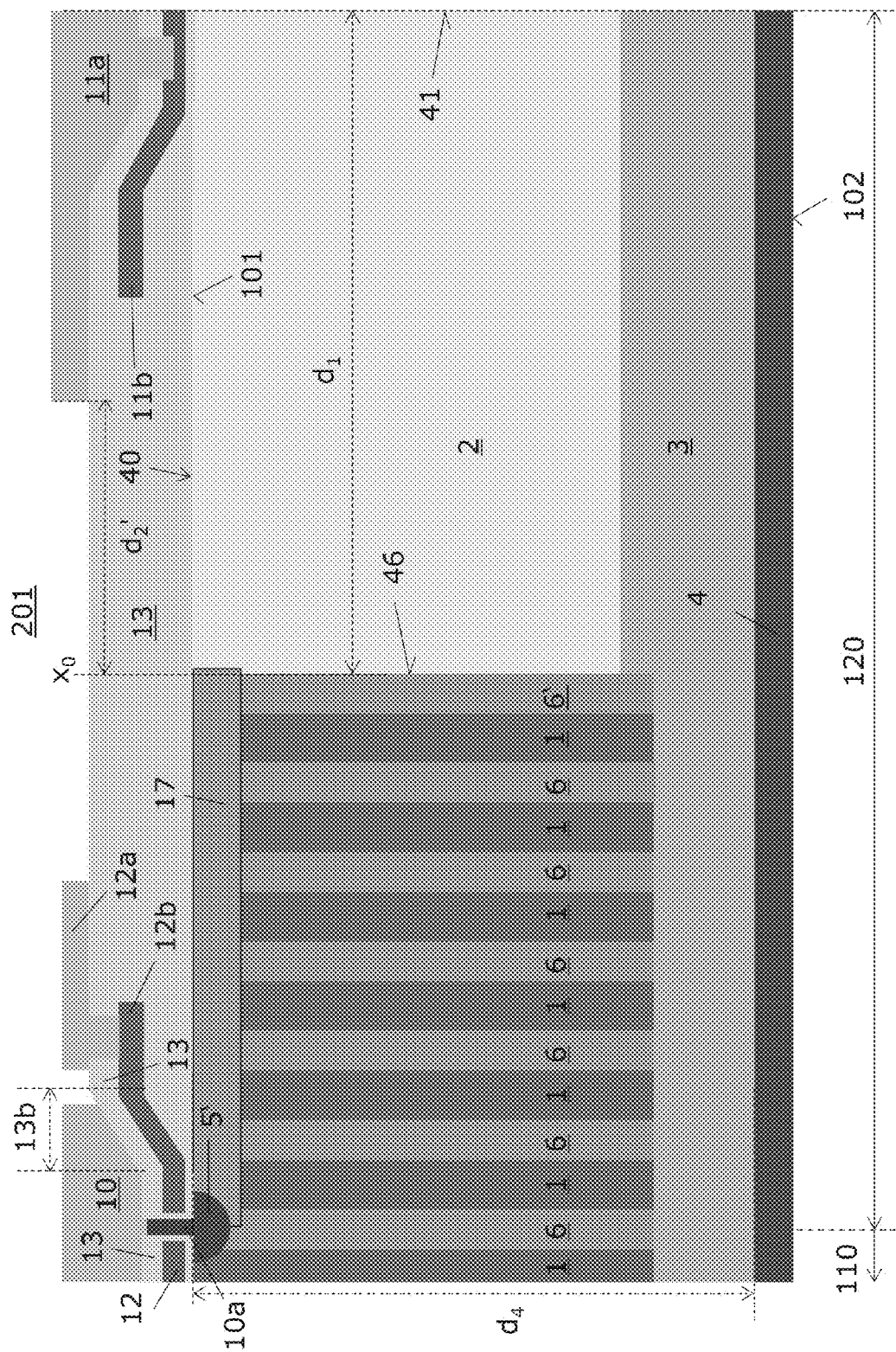
FIG. 4 illustrates a vertical cross-section through a semiconductor body of a semiconductor device according to an embodiment.

FIG. 4 illustrates a vertical cross-section through a semiconductor body 40 of a charge-compensation semiconductor device 201. The semiconductor device 201 is similar to the semiconductor device 200 explained above with regard to FIG. 3. However, the semiconductor body 40 only a field plate 11a is arranged next to the first surface 101 in the peripheral area 120 of semiconductor device 201 as equipotential region.

Further, a poly-silicon layer 11b in Ohmic contact with the field plate 11a and embedded in the dielectric region 13 may be arranged next to the edge 41 and between the field plate 11a and the first surface 101.

In the exemplary embodiment, a gate field plate 12a as explained above with regard to FIG. 2 may be arranged on the first surface 101 in the peripheral area 120 and contacted with a non-shown gate metallization via a further poly-silicon layer 12b embedded in the dielectric region 13.

Further, a poly-silicon source contact 10a between the source metallization 10 and the outermost body region 5' is shown in FIG. 4.

Figure 5:
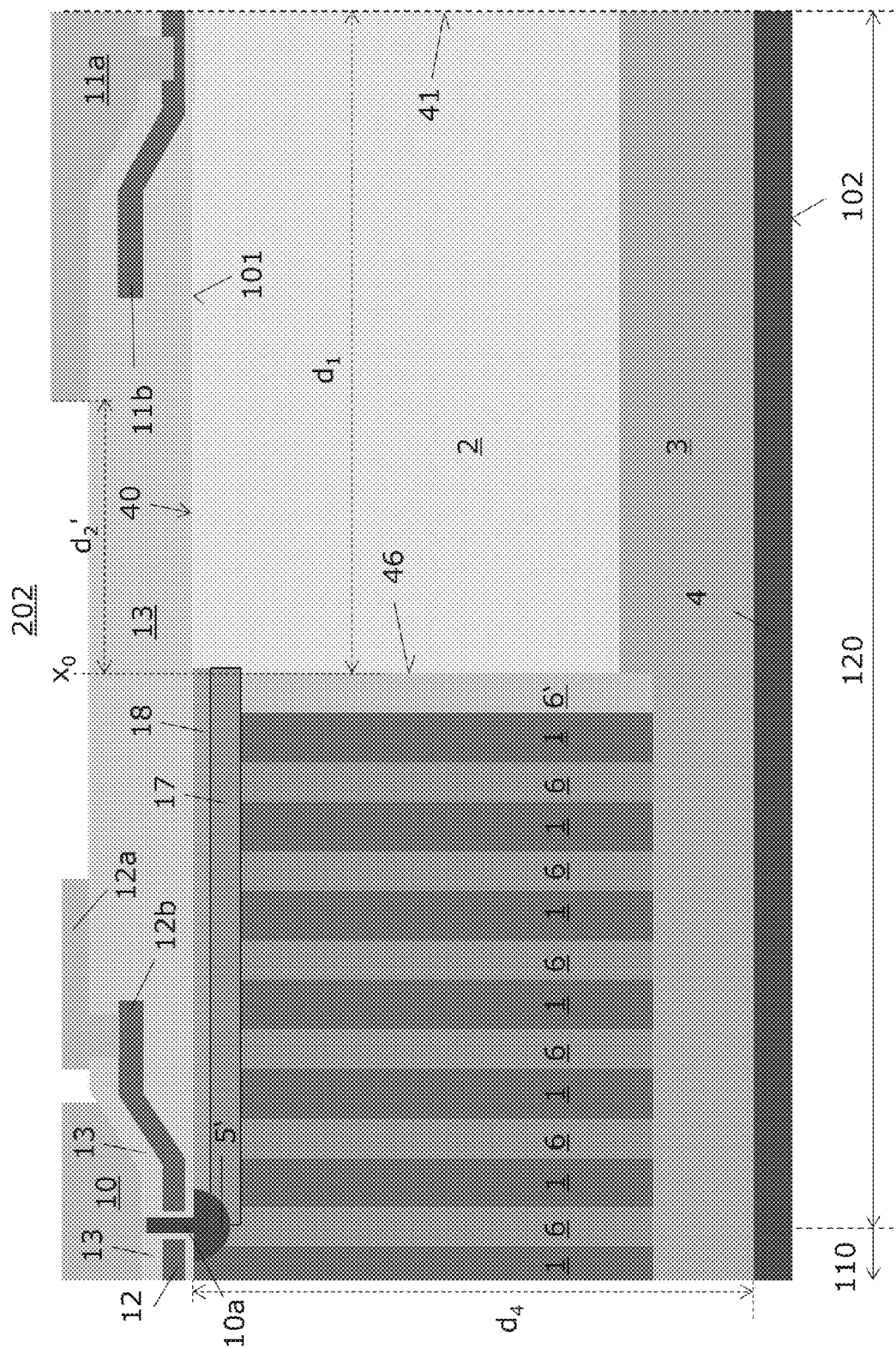
FIG. 5 illustrates a vertical cross-section through a semiconductor body of a semiconductor device according to an embodiment.

FIG. 5 illustrates a vertical cross-section through a semiconductor body 40 of a charge-compensation semiconductor device 202. The semiconductor device 202 is similar to the semiconductor device 201 explained above with regard to FIG. 4.

In the exemplary embodiment, the doping concentration of the outermost second pillar region 6' is lower than, for example in a range from about 50% to about 80% of the doping concentration of the second pillar regions 6 in the active area 120 and the other the second pillar regions 6 of the peripheral area 120. Accordingly, the transition between the compensation structure 1, 6 and the low-doped semiconductor region 2 is smoothed, i.e. the electric field distribution during the blocking mode, resulting in even lower switching losses during device operation.

Further, an n-type depletable semiconductor region 18 as explained above with regard to FIG. 1 may be arranged in the peripheral area 120 of the semiconductor device 202.

Figure 6:
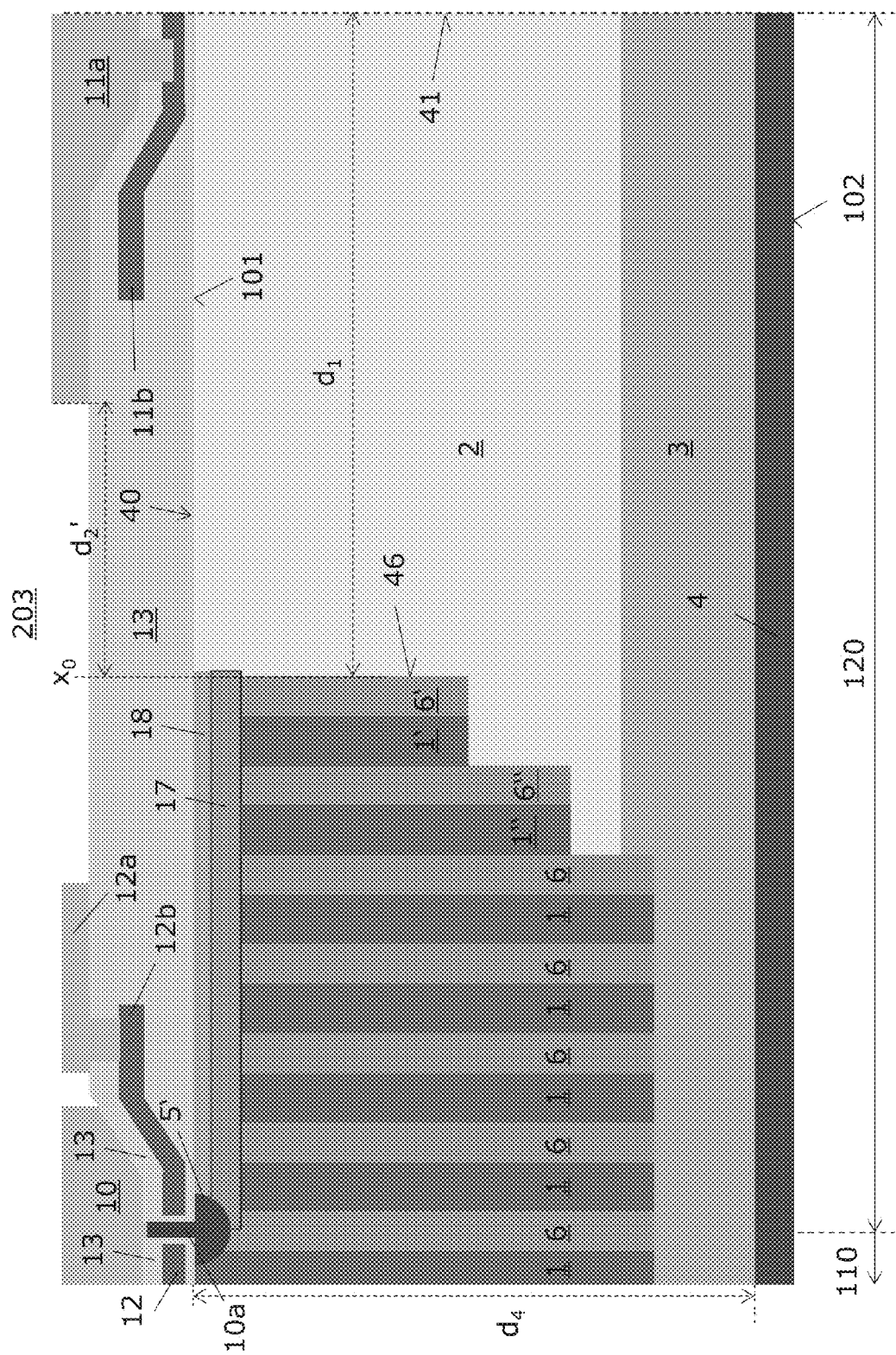
FIG. 6 illustrates a vertical cross-section through a semiconductor body of a semiconductor device according to an embodiment.

FIG. 6 illustrates a vertical cross-section through a semiconductor body 40 of a charge-compensation semiconductor device 203. The semiconductor device 203 is similar to the semiconductor device 201 explained above with regard to FIG. 4.

However, the vertical extension of the outermost first pillar regions 1' and the outermost second pillar regions 6' is lower than the vertical extension of the first and second pillar regions 1, 6 in the active area 110. Further, the second pillar region 6' (second from the right) adjoining the outermost first pillar region 1' and the first pillar region 1" (second from the right) adjoining the second pillar regions 6" have a vertical extension in between. Accordingly, the transition between the compensation structure 1, 6 and the low-doped semiconductor region 2 is also smoothed. The vertical extension of the pillar regions 1, 6 of the peripheral area 120 may also be reduced towards the edge 41 in one or more steps.

Figure 7:
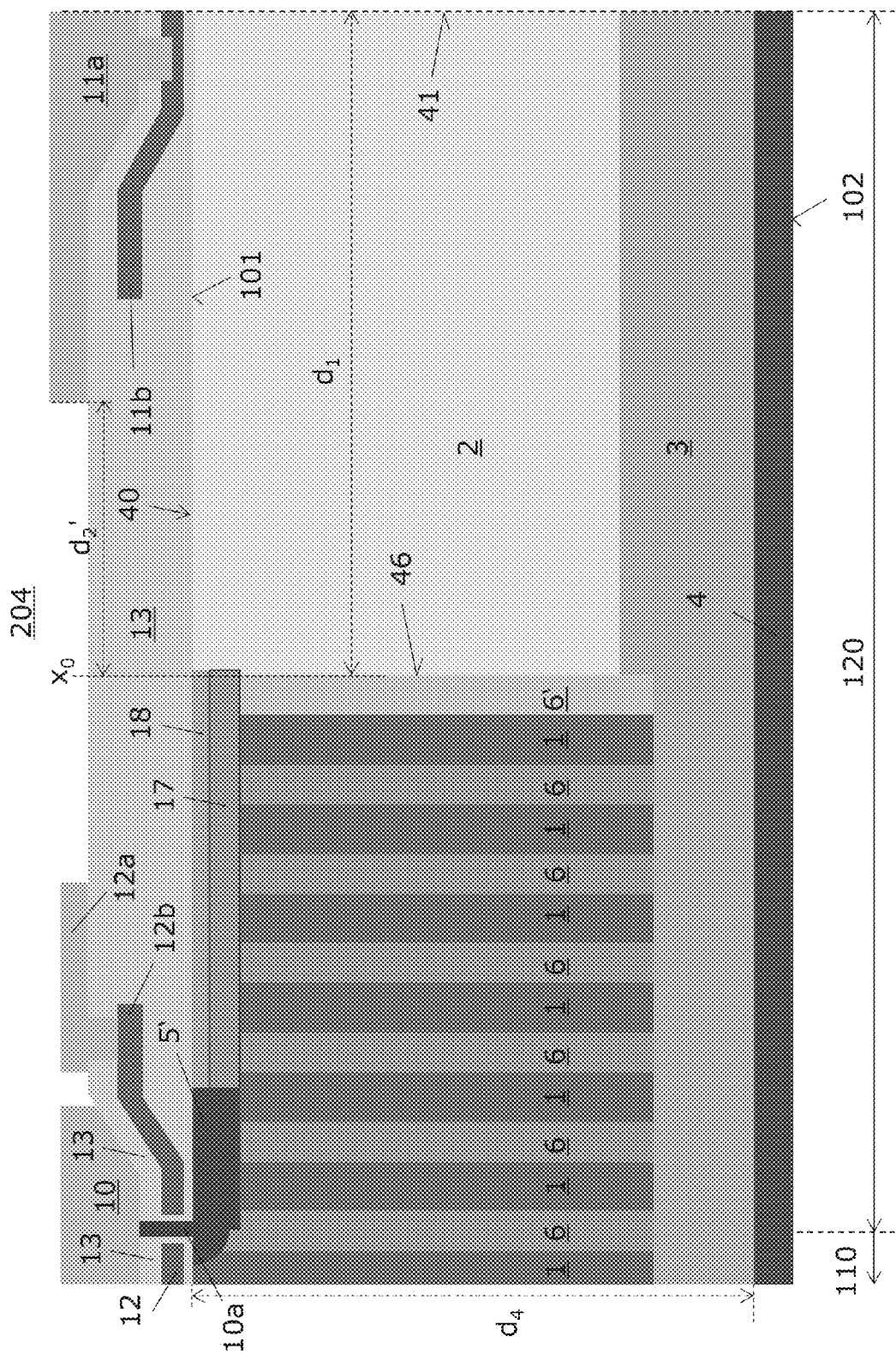
FIG. 7 illustrates a vertical cross-section through a semiconductor body of a semiconductor device according to an embodiment.

FIG. 7 illustrates a vertical cross-section through a semiconductor body 40 of a charge-compensation semiconductor device 204. The semiconductor device 204 is similar to the semiconductor device 202 explained above with regard to FIG. 5. However, the outermost body region 5' has a portion extending further towards the edge 41 and connecting one or more of the inner second pillar regions 6 of the peripheral area 120 which are thus connected with the source metallization via non-depletable semiconductor regions.

Figure 8:
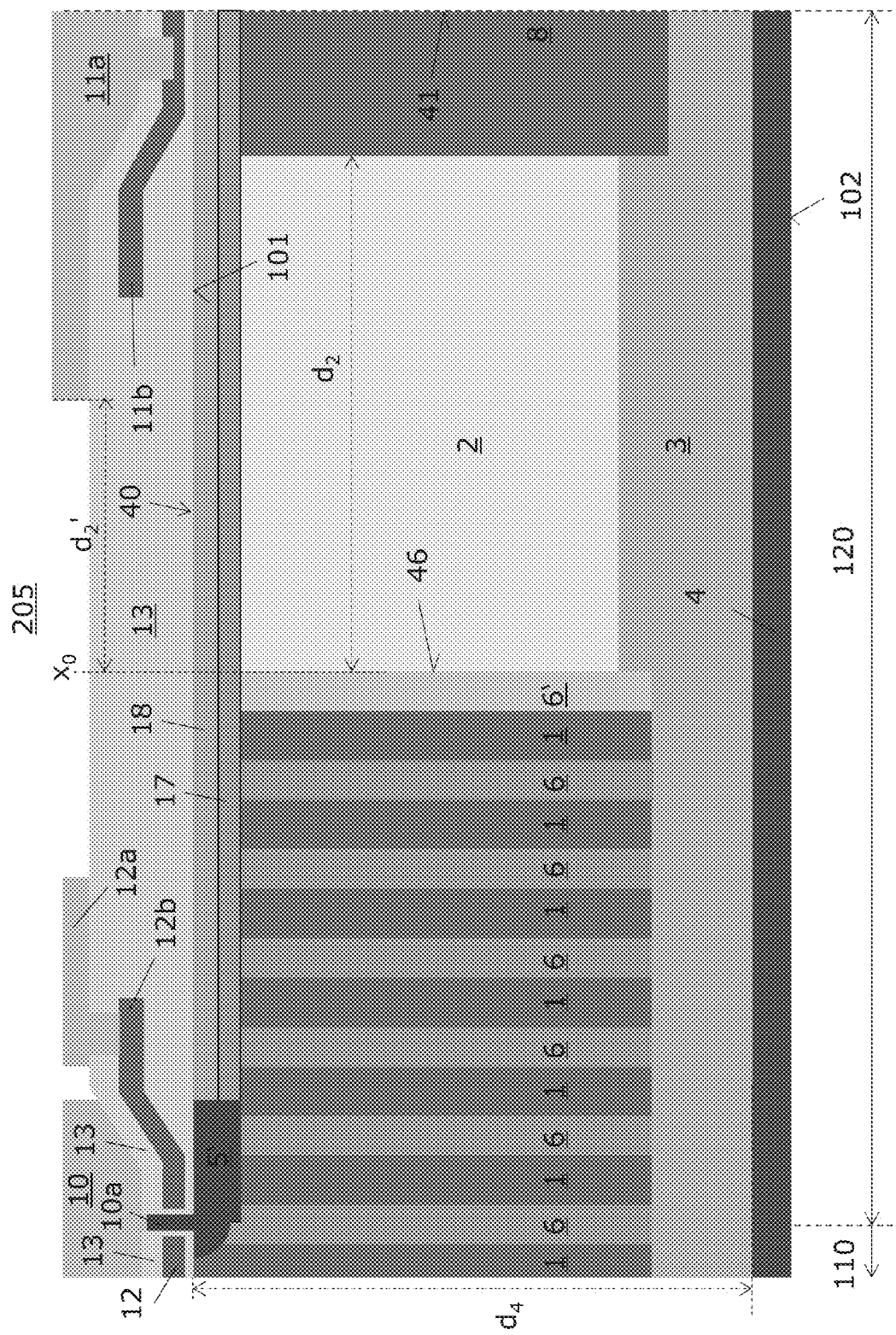
FIG. 8 illustrates a vertical cross-section through a semiconductor body of a semiconductor device according to an embodiment.

FIG. 8 illustrates a vertical cross-section through a semiconductor body 40 of a charge-compensation semiconductor device 205. The semiconductor device 205 is similar to the semiconductor device 204 explained above with regard to FIG. 7. However, the depletable semiconductor regions 17, 18 extend to the edge 41.

Further, the outermost second pillar region 6' is lower doped as explained above with regard to FIG. 5.

Even further, a field-stopper region 8 as explained above with regard to FIGS. 1 and 3 is provided at the edge 41.

Figure 9:
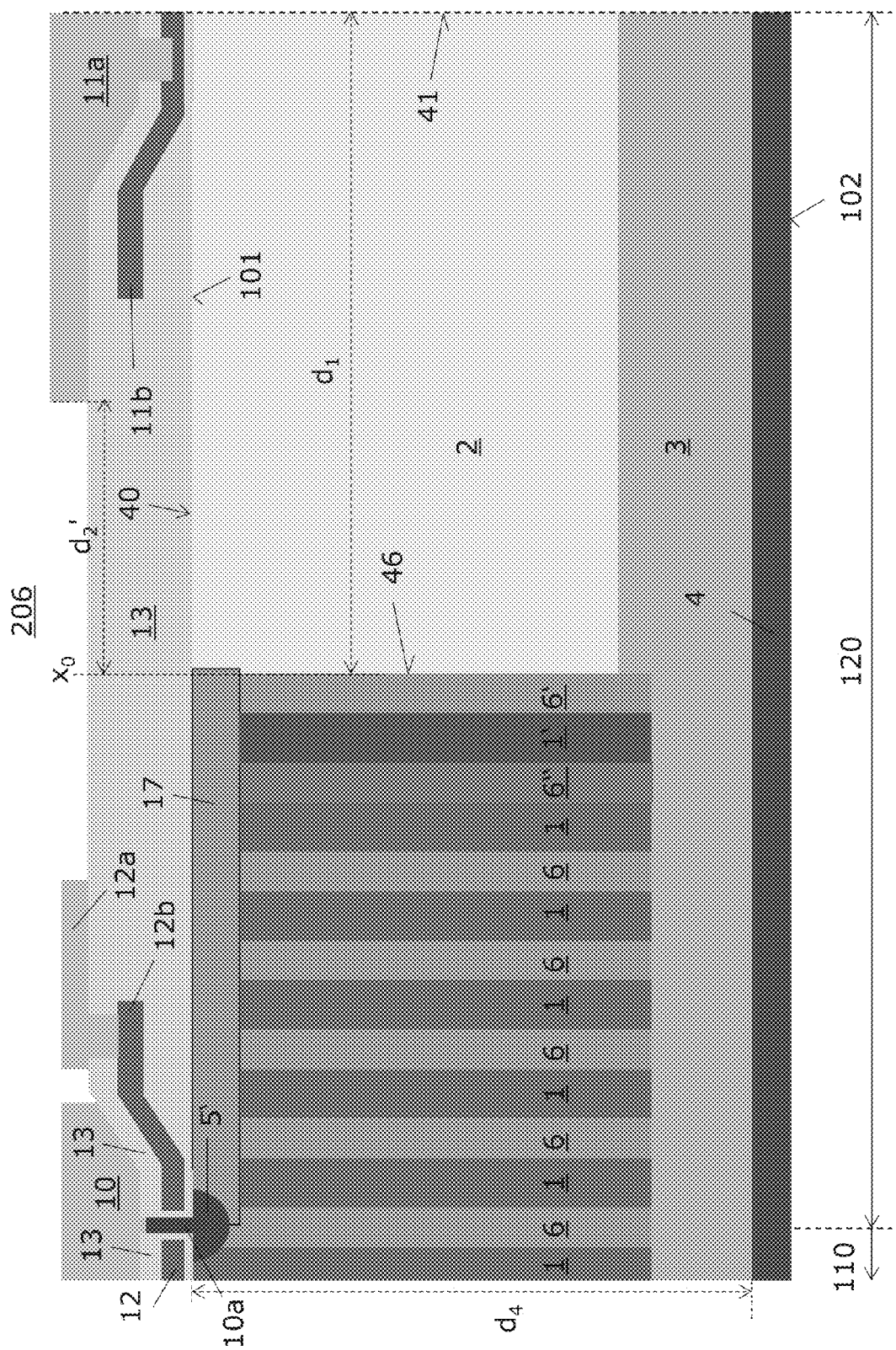
FIG. 9 illustrates a vertical cross-section through a semiconductor body of a semiconductor device according to an embodiment.

FIG. 9 illustrates a vertical cross-section through a semiconductor body 40 of a charge-compensation semiconductor device 206. The semiconductor device 206 is similar to the semiconductor device 202 explained above with regard to FIG. 4. However, at least one of the outermost first pillar region 1' and an the second pillar region 6" adjoining the outermost first pillar region 1' has a higher doping concentration than a corresponding first and second pillar region 1, 6 closer to the active area 110 and arranged in the active area 110, respectively. Accordingly, the transition between the compensation structure 1, 6 and the low-doped semiconductor region 2 is also smoothed.

Figure 10:
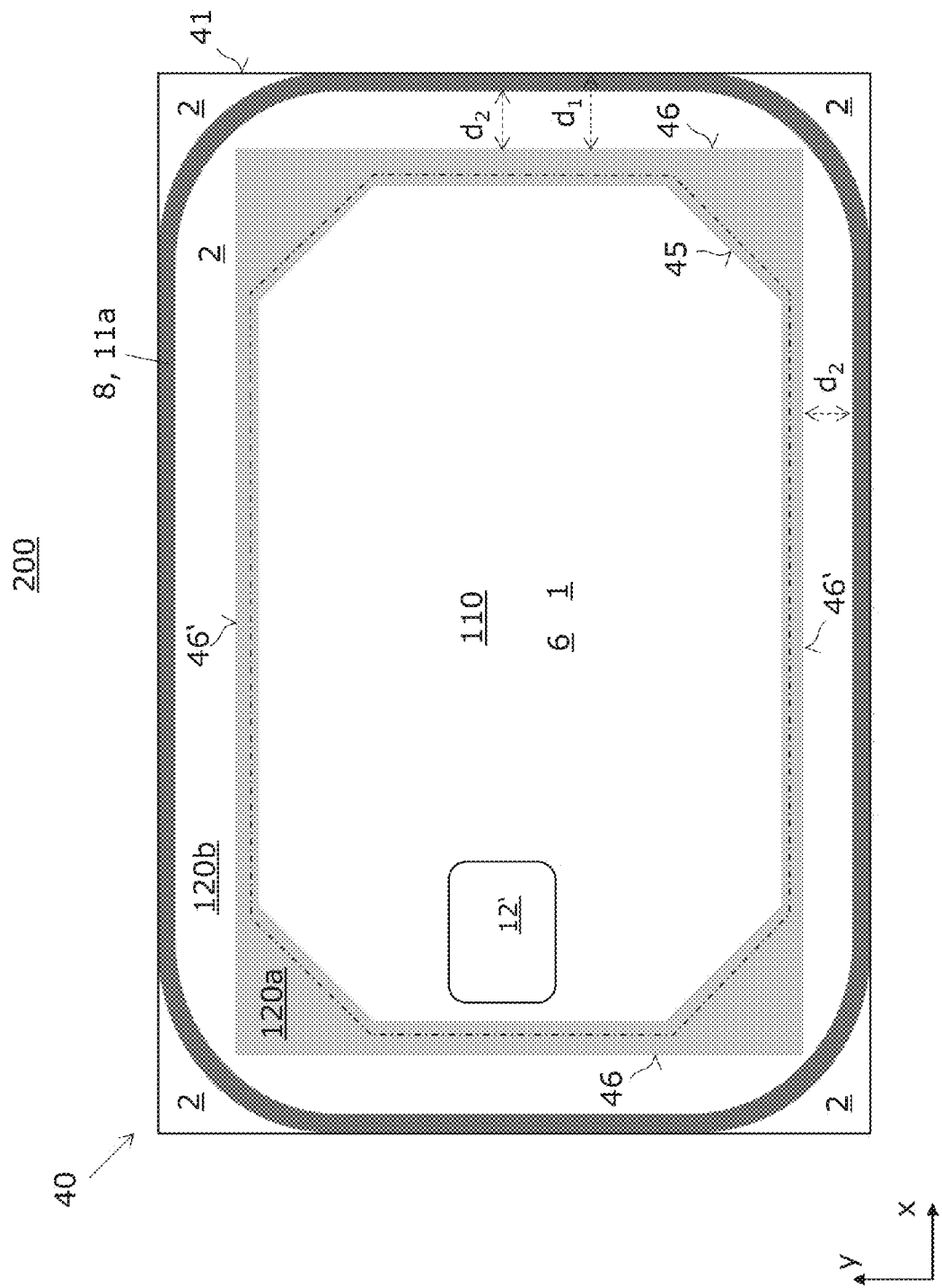
FIG. 10 illustrates a plane view on the semiconductor device illustrated in FIG. 2 according to an embodiment.

FIG. 10 illustrates a plane view on the semiconductor device 200 explained above with regard to FIG. 3. FIG. 10 may also correspond to a horizontal cross-section through the semiconductor body 40 of the semiconductor device 200.

In the exemplary embodiment, the semiconductor body 40 is, in horizontal cross-sections and when seen from above, respectively, of rectangular shape, while the boundary 45 between the active area 110 and the inner portion 120a of the active area 120 is substantially octagonal (typically a closed chain of eight non-intersecting straight line segments or sides). However, the active area 110 is, in horizontal cross-sections and when seen from above, respectively, typically not shaped as an octagon. This may be due to the presence of a gate pad 12' which is typically at least partly surrounded when seen from above. For sake of clarity, the alternating first pillar regions 1 and second pillar regions 6 which may extend in the x-direction are not shown in FIG. 10. The doping concentrations of the first and second pillar regions 1, 6 below the gate pad 12' may be the same as in the active area 110.

The first and second pillar regions 1, 6 may substantially be shaped as bands and elongated parallel rectangles having a large aspect ratio of more than about 10 or even more than about 100, respectively, that extend in y-direction when seen from above.

While the left and right boundary 46 between the inner portion 120a and the outer portion 120b may be formed by the pn-junction 46 between the low-doped semiconductor region 2 and the respective outermost second pillar region 6 (6' in FIG. 3), the boundaries 46' between the inner portion 120a and the outer portion 120b is typically formed between the low-doped semiconductor region 2 and the alternating first and second pillar regions 1, 6. In the exemplary embodiment, the boundary 46, 46' between the outer portion 120b and the inner portion 120a is rectangular when seen from above.

The first and second pillar regions 1, 6 may extend between the two boundaries 46' with the inner first and second pillar regions 1, 6 that extend across the active area 110, i.e. from the active area 110 into the inner portion 120a of the peripheral area 120.

Typically, the doping concentration of the first and second pillar regions 1, 6 is lower in the inner portion 120a of the peripheral area 120 compared to the active area 110. As indicated by the dashed dotted line in FIG. 10, the doping concentrations of the first and second pillar regions 1, 6 may be lowered in an innermost transitional region from about 100% to a lower value of about 90°, 80%, 60%, 50%, 40% or even only about 20%. Accordingly, the spacing between equipotential surfaces during the blocking mode may be more uniform across the semiconductor body 40.

Figure 11:
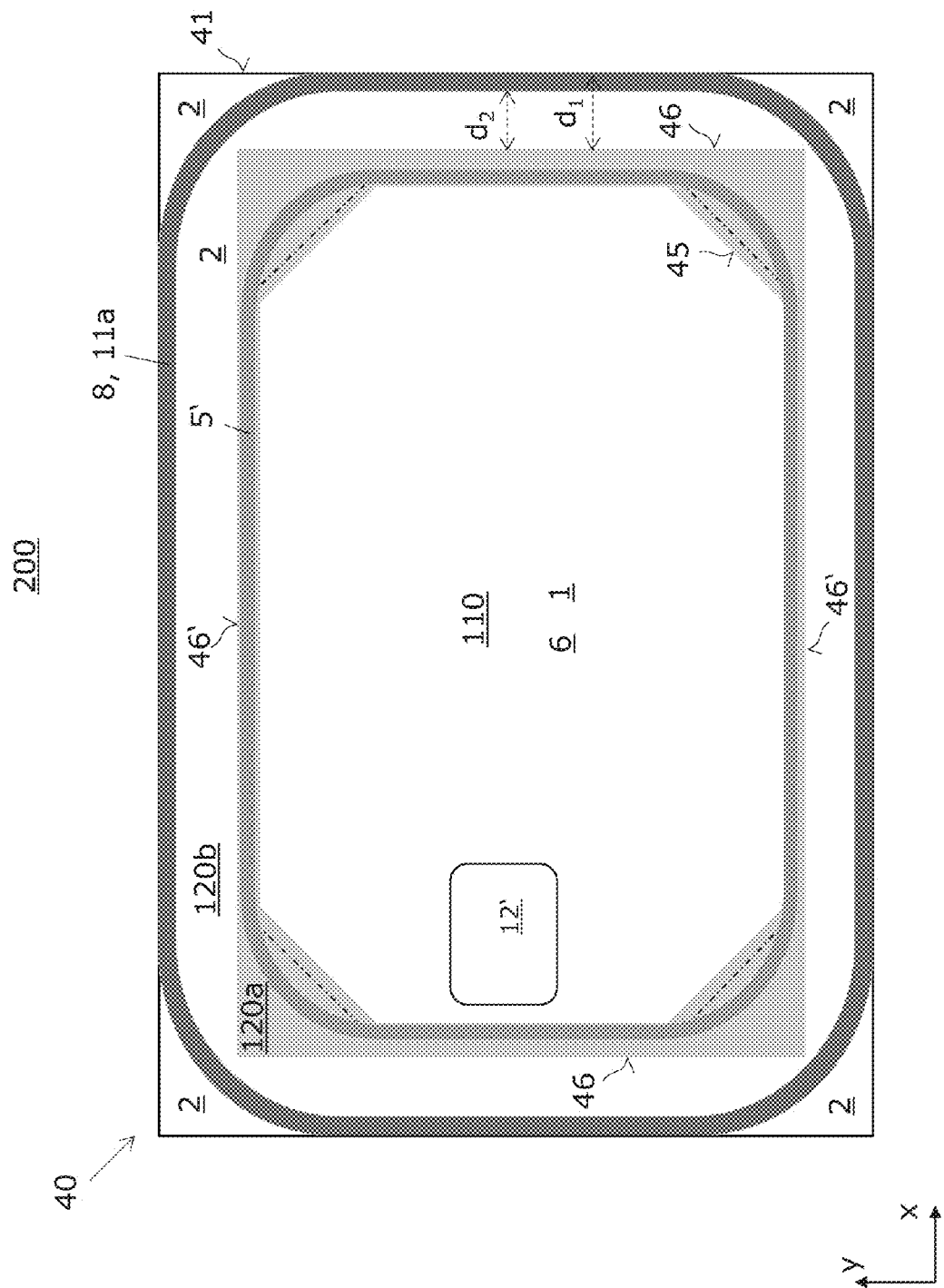
FIG. 11 illustrates a plane view on the semiconductor device illustrated in FIG. 2 according to another embodiment.

In FIG. 11 a typical arrangement of the outermost body region 5' is additionally illustrated.

Figure 12:
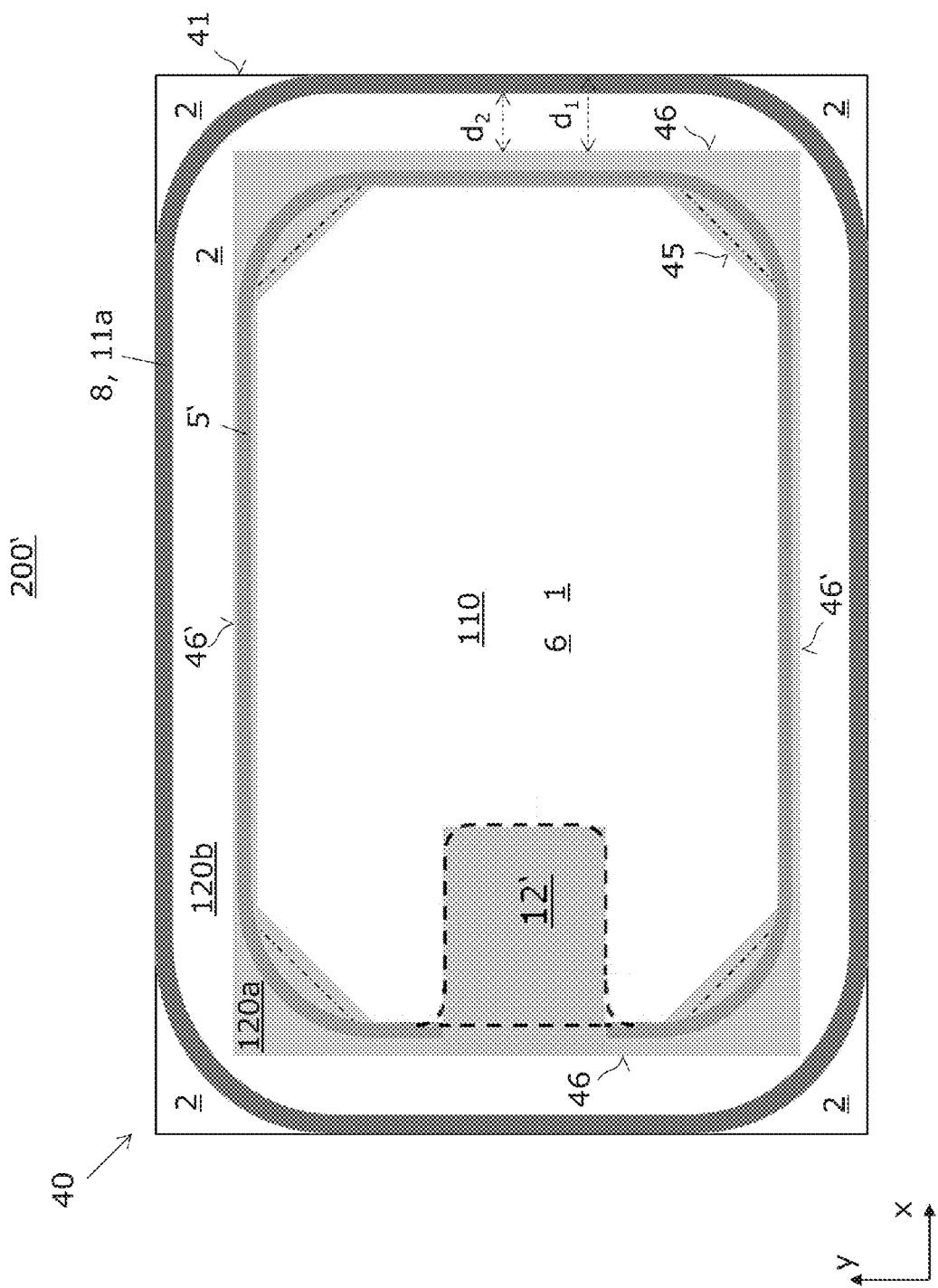
FIG. 12 illustrates a plane view on a semiconductor device as illustrated in FIG. 2 according to yet another embodiment.

The semiconductor device 200' illustrated in FIG. 12 in a plane view and a horizontal cross-section, respectively, is similar to the semiconductor device 200 explained above with regard to FIGS. 3, 10 and 11. However, the gate pad 12' is only partly surrounded by the active area 110 when seen from above. Further, the doping concentrations of the first and second pillar regions 1, 6 may be lowered below the gate pad 12' compared to the active area 110.

In another embodiment, the gate pad is, when seen from above, formed in the outer portion 120b of the peripheral area 120.

Figure 13:
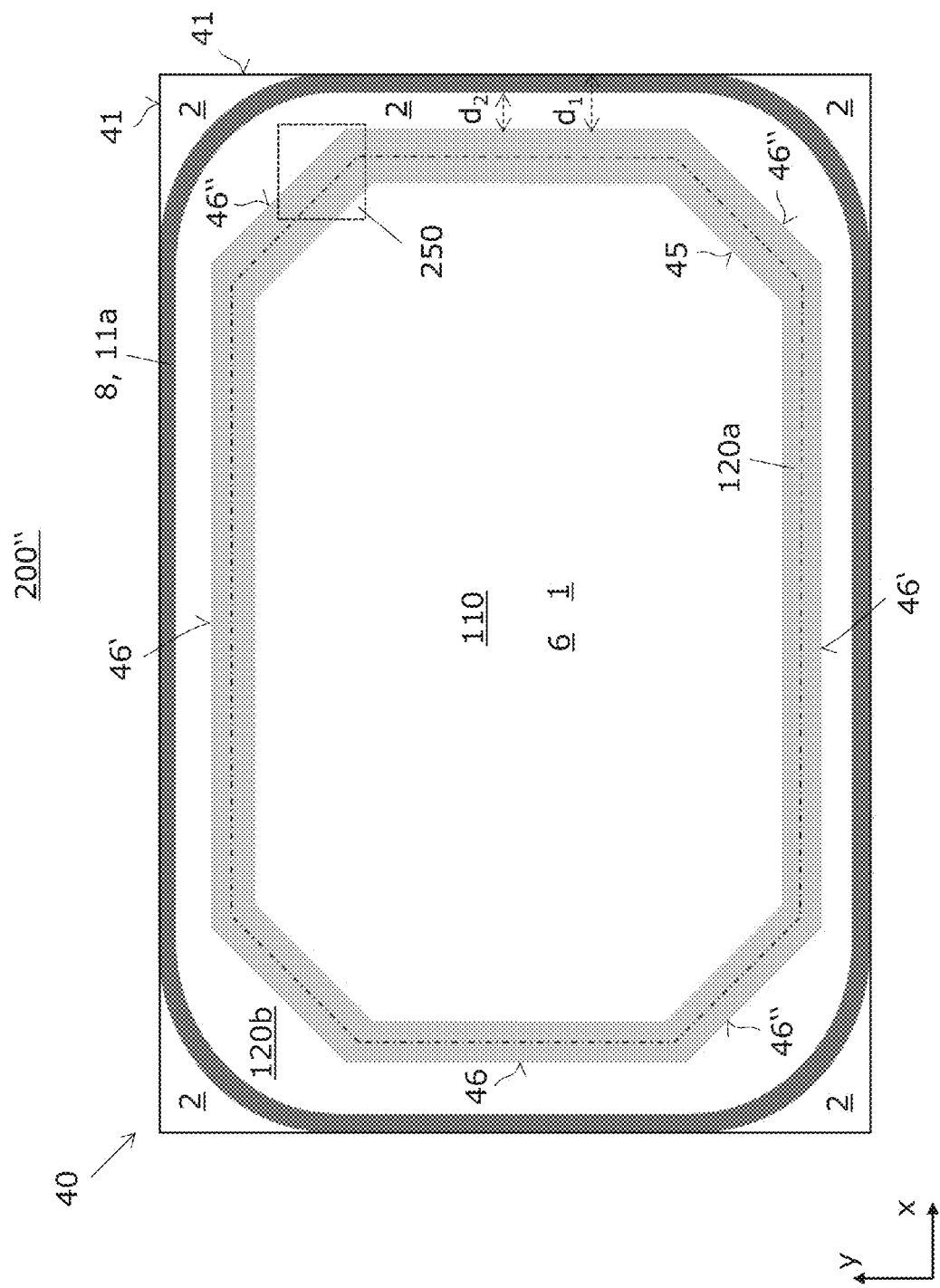
FIG. 13 illustrates a plane view on a semiconductor device as illustrated in FIG. 2 according to yet another embodiment.

The semiconductor device 200" illustrated in FIG. 13 in a plane view and a horizontal cross-section, respectively, is similar to the semiconductor device 200 explained above with regard to FIGS. 3, 10 and 11. However, the four corner regions of the peripheral area 120 are designed differently. When seen from above and in a horizontal cross-section, respectively, the boundary 46, 46', 46" between the outer portion 120b and the inner portion 120a of semiconductor device 200" is octagonal and has four boundaries 46" which form a 45° angle with each of the four vertical sides 41 of the edge 41.

In other embodiments, the boundary between the outer portion 120b and the inner portion 120a of the peripheral area 120 may have in the corner regions portions forming a 30° or a 60° angle with the outer edge.

According to an embodiment of a charge-compensation semiconductor device, the charge-compensation semiconductor device 200, 200', 200" includes a semiconductor body 40 having a first surface (101), a second surface (102) arranged opposite to the first surface, and an edge 41 delimiting the semiconductor body 40 in a horizontal direction substantially parallel to the first surface. The semiconductor body 40 is typically shaped as a rectangle when seen from above. An active area 110 of the semiconductor body 40 is substantially shaped as an octagon when seen from above. A peripheral area 120 is arranged between the active area 110 and the edge 41. A low-doped semiconductor region 2 having a first concentration of dopants is arranged in an outer portion 120b of the peripheral area 120 and may extend to the edge 41. An inner portion 120a the peripheral area 120 is arranged between the active area 110 and the outer portion 120b of the peripheral area 120. A boundary 46, 46', 46" between the inner portion 120a and the outer portion 120b of the peripheral area 120 is, in a corner region of the peripheral area 120 next to two adjacent vertical sides of the edge 41, substantially parallel to one of the two vertical sides or forms an angle of about 60°, 45° or 30° with the edge 41. For example, the boundary 46, 46', 46" between the outer portion 120b and the inner portion 120a may be a polygonal boundary, e.g. rectangular or octagonal, when seen from above. A source metallization (10) is arranged on the first surface, and a drain metallization (11) is arranged opposite to the source metallization (10). In a vertical cross-section substantially orthogonal to the first surface, the charge-compensation semiconductor device further includes a plurality of first pillar regions 1 alternating with second pillar regions 6 in the active area 110. The first pillar regions 1 and the second pillar regions 6 extend into the inner portion 120a of the peripheral area 120. The first pillar regions 1 have a second concentration of dopants of the first conductivity type higher than the first concentration and are in Ohmic contact with the drain metallization (11). The second pillar regions 6 are of a second conductivity type and in Ohmic contact with the source metallization (10). When seen from above, the first pillar regions 1 are substantially parallel to each other and to the second pillar regions 6. The respective doping concentration of the first pillar regions 1 and the second pillar regions 6 are lower in the inner portion 120a compared to the active area 110.

According to numerical simulation (not shown), this layout has several advantages. During a blocking mode, high electric field strength may be avoided (n particular in the corner regions). The curvature of the depletion region during the blocking mode may be fine-tuned. Accordingly, a particularly high blocking voltage may be achieved. Further, the design is more tolerant with regard to layout variations (manufacturing tolerances).

Charge compensation semiconductor devices are mainly produced with a so-called 'multiple epitaxy' process. In this case, an n-doped epitaxial layer, which may be several µm thick, is first grown on a highly n-doped substrate and commonly referred to as 'buffer epi'. In addition to a doping level introduced in the epitaxial step doping ions are introduced into the buffer epi through a photoresist mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge compensation regions (compensation regions) and n-type charge compensation regions (drift portions). The manufacturing of the actual devices can then be conducted at this point.

Another conventional technique for fabricating charge compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, a deeper trench is etched, which determines the form of the p-column. This trench is then filled with p-doped epi which is free of crystal defects. However, the integration of doping during an epi process is possible only with relatively large fluctuations. In particular with very small dimensions, the corresponding fluctuations quickly exceed the window provided for the process, which can lead to significant yield losses. Also, a vertical variation of the doping profile (and thus also of the vertical development of the strength of the field) is not possible. It may therefore be difficult to meet various robustness criteria with this technique. For these reasons n-type and p-type dopants of the charge compensation structures are in the following mainly introduced by implanting.

Both techniques may be used to manufacture the charge compensation semiconductor devices as explained above with regard to FIGS. 1 to 13. Such a method may include providing a semiconductor body 40, typically a wafer, comprising a first surface 102, a second surface 101 arranged opposite to the first surface, a drain region 8 of a first conductivity type extending to the second surface 102, an active area 110, and a peripheral area 120 surrounding the active area 110. In a vertical cross-section substantially orthogonal to the first surface 101 the semiconductor body 40 includes a low-doped semiconductor region 2 having a first concentration of dopants and arranged the peripheral area, a plurality of first pillar regions 1 alternating with second pillar regions 6 in the active area 110 and the peripheral area 120. The first pillar regions 1 have a second concentration of dopants of a first conductivity type higher than the first concentration. Between adjoining first pillar regions 1 and second pillar regions 2 a respective pn-junction is formed. At least one of an outermost of the first pillar regions 1 and an outermost of the second pillar regions 6 forms an interface 46 with the low-doped semiconductor region. A connecting region 17 of the second conductivity type is arranged in the peripheral area 120 and adjoins at least a majority of the second pillar regions 6 of the peripheral area 120.

The method may further include forming in the peripheral area an equipotential structure (one or more equipotential regions) 8, 11*a* at least next to the first surface, forming a source metallization 10 on the first surface 101 in Ohmic contact with the second pillar regions 6 of the active area 110 and with the connecting region 17, forming a drain metallization 11 opposite to the source metallization 10 and in Ohmic contact with the equipotential structure 8, 11*a* and the first pillar regions 1, and cutting the semiconductor body 40 to form an edge 41 extending between the first surface 101 and the second surface 102 and surrounding the active area 120. The method is typically formed such that a horizontal distance d2, d2' between the interface 46 and the equipotential structure 8, 11*a* divided by a vertical distance d4 between the first surface 101 and the drain region 4 is in a range from about 0.5 to about 3, more typically from about 0.8 to about 1.5.

Forming the equipotential region structure may include at least one of forming a field plate 11*a* on the first surface 101, forming below the first surface a field-stopper region 8 of the first conductivity type adjoining the low-doped semiconductor region 2 and having a concentration of dopants higher than the first concentration, and/or forming a doped poly-silicon region between the field plate 11*a* and the field-stopper region 8.

Figure 14:
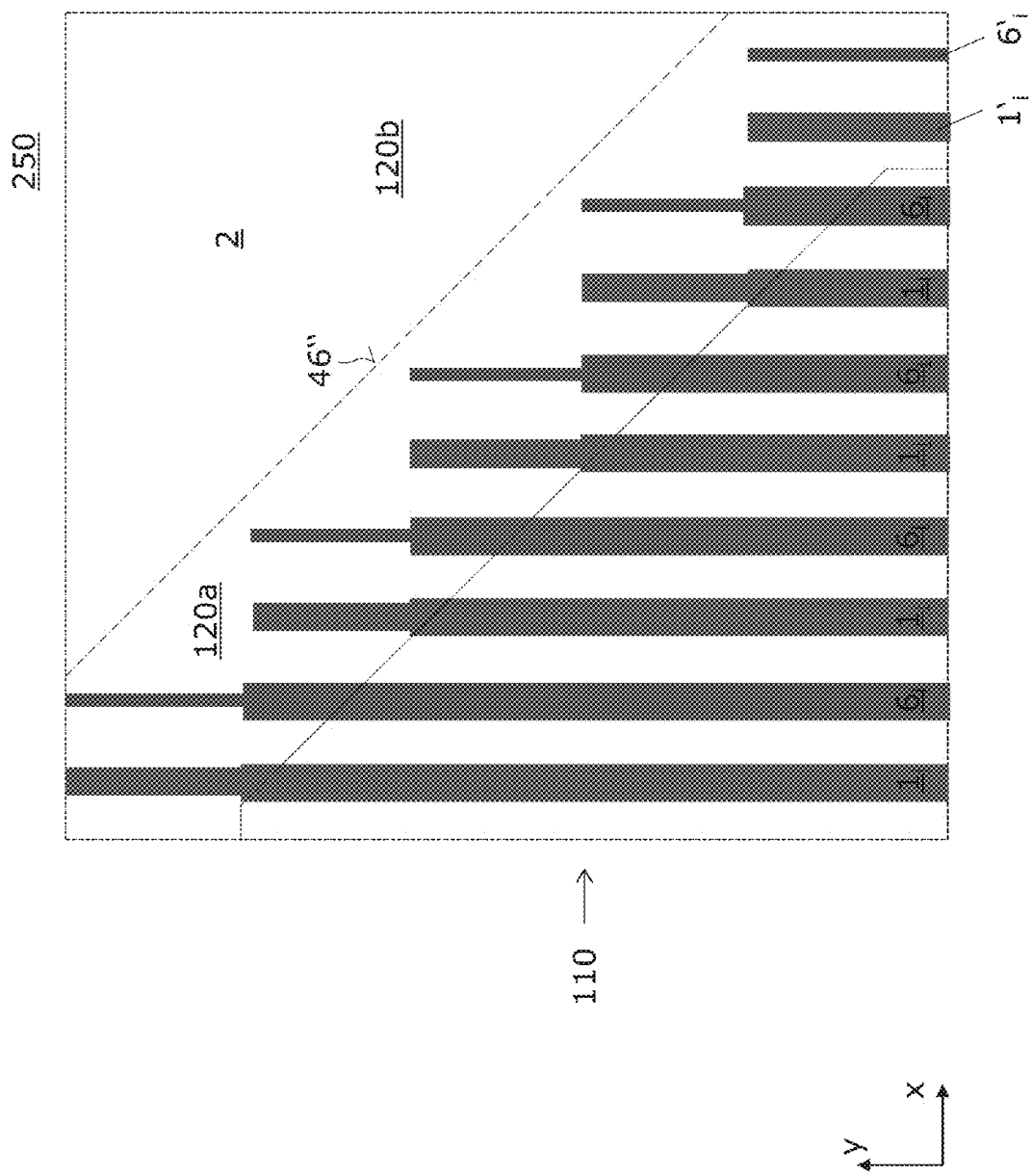
FIG. 14 illustrates a mask layout according to an embodiment.
Figure 15:
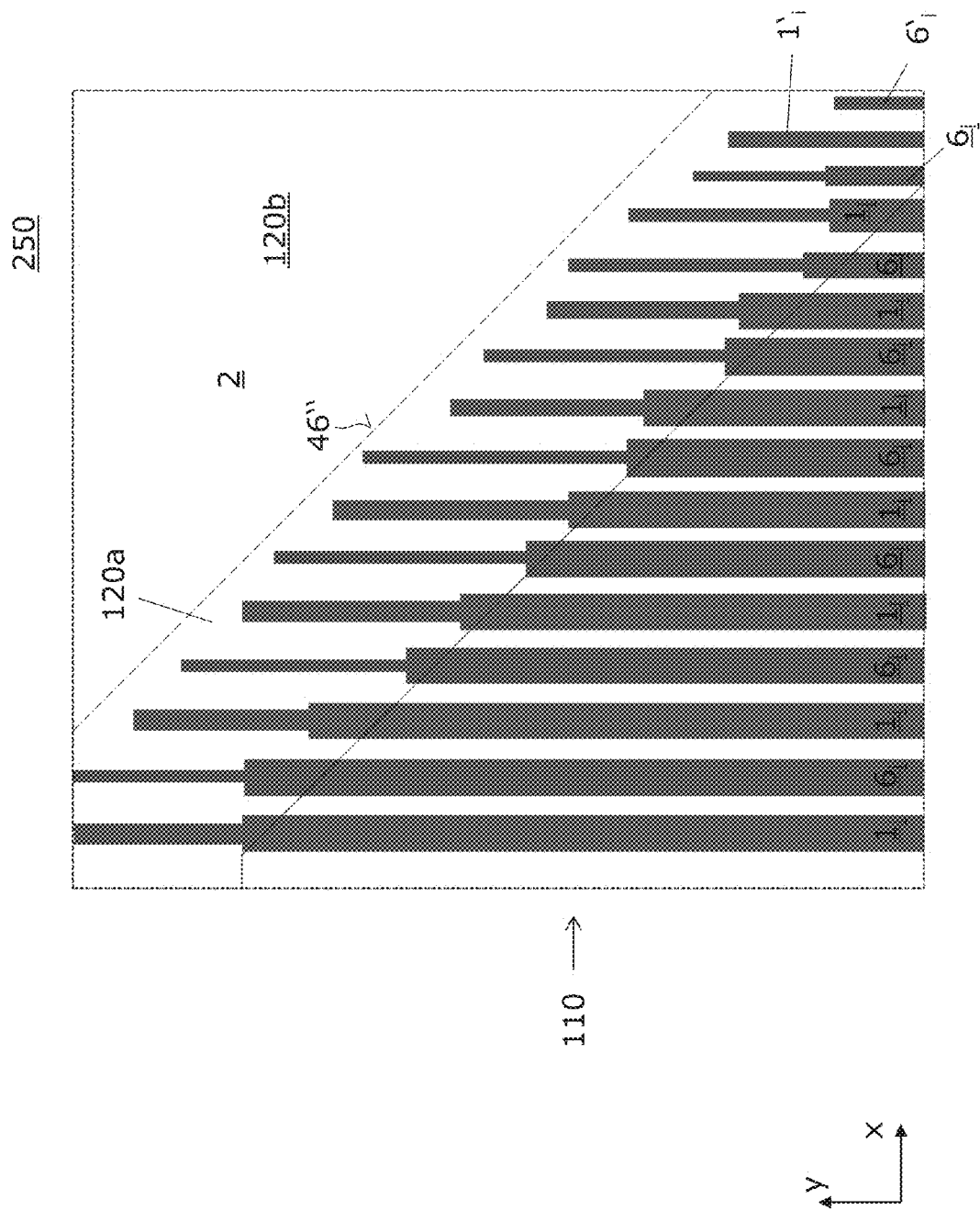
FIG. 15 illustrates a mask layout according to an embodiment.

The first and second pillar regions 1, 6 may be formed using a mask layout as illustrated in FIGS. 14, 15. For sake of clarity, the illustrated mask layouts correspond to a small section 250 illustrated in FIG. 13.

After providing the semiconductor body (wafer) 40 with a low-doped (e.g. intrinsic) semiconductor layer 2 extending to the main surface, an active area 110 of octagonal shape and a peripheral area 120 with an outer portion 120*b* and an inner portion 120*a* arranged between the active area 110 an the outer portion 120*b* may be defined.

Thereafter, donor ions may be implanted through a first implantation mask (first mask) 1, arranged on the main surface for forming the first pillar regions 1, and acceptor ions may be implanted through a second implantation mask (second mask) 6, arranged on the main surface for forming the second pillar regions 6. Typically, several implantations with different ion energy are used prior to a common anneal to activate the implanted donors and acceptors.

As illustrated in FIGS. 14 and 15, the first mask $1_i$, $1'_i$ has first openings $1_i$ extending, in the first horizontal direction y, from the active area 110 into the inner portion(s) 120*a* where they terminate, and the second mask $6i$, $6'_i$ has second openings 6, extending in y-direction from the active area 110 into the inner portion(s) 120*a* of the peripheral area 120 where they terminate. The first mask $1_i$, $1'_i$ and the second mask $6i$, $6'_i$ typically also include respective outer openings $1'_i$, $6'_i$ which are only arranged in the inner portion 120*a* of the peripheral area 120 but not in the active area 110. A horizontal extension of the first openings $1_i$ and the second openings $6_i$ in a second horizontal direction (x-direction) is larger in the active area 110 compared to the inner portion 120*a*. Likewise, the extension in x-direction of the outer openings $1'_i$, $6'_i$ is lower than the extension in x-direction of the openings $1_i$, $6_i$ in the active area 110.

Accordingly, first and second pillar regions 1, 6 having a reduced doping concentration in the inner portion 120*a* of the peripheral area 120 compared to the active area 110 and second pillar regions 1 having a reduced doping concentration in the inner portion 120*a* of the peripheral area 120 compared to the active area 110 are formed such that the first pillar regions 1 and the second pillar regions 6 are at least piece-wise substantially parallel to each other and that a boundary 46" between the inner portion 120*a* and the outer portion 120*b* of peripheral area 120 is, in a corner region, where two vertical sides of the edge 41 are at least close to each other, substantially parallel to one of the two vertical sides or forms an angle of about 45° with the two vertical sides.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A charge-compensation semiconductor device, comprising:
   a rated breakdown voltage;
   a semiconductor body comprising a first surface, an edge delimiting the semiconductor body in a horizontal direction substantially parallel to the first surface, an active area, and a peripheral area arranged between the active area and the edge;
   a source metallization arranged on the first surface; and
   a drain metallization arranged opposite to the source metallization,
in a vertical cross-section substantially orthogonal to the first surface the semiconductor body further comprising:
   an intrinsic semiconductor region arranged in the peripheral area; and
   a plurality of first pillar regions alternating with second pillar regions in the active area and the peripheral area, the first pillar regions having a higher doping concentration than the intrinsic semiconductor region, the first pillar regions being in Ohmic contact with the drain metallization, the second pillar regions of the active area being in Ohmic contact with the source metallization via respective body regions having a higher doping concentration than the second pillar regions, at least a majority of the second pillar regions of the peripheral area adjoining a connecting region which is of the same conductivity type as the second pillar regions and has a lower doping concentration than an adjoining outermost of the body regions, between adjacent first pillar regions and second pillar regions a respective pn-junction being formed, at least one of an outermost of the first pillar regions and an outermost of the second pillar regions forming an interface with the intrinsic semiconductor region at a horizontal position where a voltage at the first surface is at least about a fifth of the rated breakdown voltage when the rated breakdown voltage is applied between the source metallization and the drain metallization.

2. The charge-compensation semiconductor device of claim 1, wherein the interface is formed at a horizontal position where the voltage at the first surface is at least about a third of the rated breakdown voltage when the rated breakdown voltage is applied between the source metallization and the drain metallization; and/or wherein the interface is formed at a horizontal position where the voltage at the first surface is lower than about four fifths of the rated breakdown voltage when the rated breakdown voltage is applied between the source metallization and the drain metallization.

3. The charge-compensation semiconductor device of claim 1, wherein the peripheral area comprises an outer portion which is devoid of both the first pillar regions and the second pillar regions, and an inner portion arranged between the active area and the outer portion, wherein a boundary between the inner portion and the outer portion of the peripheral area is, in a corner region of the peripheral area next to two adjacent vertical sides of the edge, substantially parallel to one of the two vertical sides or forms an angle of about 60°, 45° or 30° with the edge.

4. The charge-compensation semiconductor device of claim 3, wherein the doping concentration of the first pillar regions is lower in the inner portion of the peripheral area compared to the active area, and/or wherein the doping concentration of the second pillar regions is lower in the inner portion of the peripheral area compared to the active area.

5. The charge-compensation semiconductor device of claim 1, wherein a horizontal distance between the edge and the interface divided by a horizontal distance between the source metallization and the interface is in a range from about 0.1 to about 0.9.

6. The charge-compensation semiconductor device of claim 1, further comprising at least one of
an equipotential region which is in Ohmic contact with the drain metallization and arranged next to the edge and the first surface, wherein a horizontal distance between the interface and the equipotential region divided by a horizontal distance between the source metallization and the interface is in a range from about 0.2 to about 5; and
a drain region adjoining the drain metallization at a second surface of the semiconductor body, in Ohmic contact with the first pillar regions and having a higher doping than the first pillar regions, and an equipotential region which is in Ohmic contact with the drain metallization and arranged next to the edge and the first surface, wherein a horizontal distance between the interface and the equipotential region divided by a vertical distance between the first surface and the drain region is in a range from about 0.5 to about 3.

7. The charge-compensation semiconductor device of claim 6, wherein the equipotential region comprises at least one of a field plate arranged on the first surface, and a field-stopper region adjoining the intrinsic semiconductor region and having a higher average concentration of dopants of the first conductivity type than the intrinsic semiconductor region.

8. The charge-compensation semiconductor device of claim 6, wherein the connecting region extends at least close to the field-stopper region.

9. The charge-compensation semiconductor device of claim 1, wherein the doping concentration of the first pillar regions is at least about ten times a doping concentration of the intrinsic semiconductor region.

10. The charge-compensation semiconductor device of claim 1, wherein at least one of the second pillar regions in the peripheral area substantially extends into the same depth as the second pillar regions in the active area.

11. The charge-compensation semiconductor device of claim 1, wherein a vertical extension of at least one of the second pillar regions in the peripheral area is lower than a vertical extension of the second pillar regions in the active area.

12. The charge-compensation semiconductor device of claim 1, wherein a doping concentration of at least one of the second pillar regions in the peripheral area differs from a doping concentration of the second pillar regions in the active area.

13. The charge-compensation semiconductor device of claim 1, further comprising a depletable semiconductor region arranged between the connecting region and the first surface, forming a pn-junction with the connecting region, having a higher doping concentration than the intrinsic semiconductor region.

14. A charge-compensation semiconductor device, comprising:
a semiconductor body comprising a first surface, a second surface arranged opposite to the first surface, an edge delimiting the semiconductor body in a horizontal direction substantially parallel to the first surface, a drain region of a first conductivity type extending to the second surface, an active area, and a peripheral area arranged between the active area and the edge;
a source metallization arranged on the first surface; and
a drain metallization arranged on the drain region and in Ohmic contact with the drain region,
in a vertical cross-section substantially orthogonal to the first surface the charge-compensation semiconductor device further comprising:
an equipotential region in Ohmic contact with the drain metallization and arranged in the peripheral area and next to the first surface;
a low-doped semiconductor region arranged in the peripheral area and having a first concentration of dopants; and
a plurality of first pillar regions alternating with second pillar regions in the active area and the peripheral area, the first pillar regions having a second concentration of dopants of the first conductivity type higher than the first concentration of dopants, the first pillar regions being in Ohmic contact with the drain region, the second pillar regions being of a second conductivity type and in Ohmic contact with the source metallization, at least one of an outermost of the first pillar regions and an outermost of the second pillar regions forming an interface with the low-doped semiconductor region, wherein a horizontal distance between the interface and the equipotential region divided by a vertical distance between the first surface and the drain region is in a range from about 0.5 to about 3.

15. The charge-compensation semiconductor device of claim 14, further comprising at least one of a first depletable semiconductor region of the second conductivity type connecting at least the majority of the second pillar regions of the peripheral area, a second depletable semiconductor region of the first conductivity type having a concentration of dopants higher than the first concentration of dopants and arranged between the first depletable semiconductor region and the first surface, and a plurality of body regions of the second conductivity type, each of the body regions having in the active area a higher doping concentration than an adjoining second pillar region and an outermost of the body regions having a higher doping concentration than the adjoining first depletable semiconductor region.

16. The charge-compensation semiconductor device of claim 14, wherein the equipotential region comprises at least one of a field plate arranged on the first surface, a field-stopper region of the first conductivity type adjoining the low-doped semiconductor region and having a concentration of dopants higher than the first concentration of dopants, and a polysilicon region arranged between the field plate and the field-stopper region.

17. The charge-compensation semiconductor device of claim 14, wherein the low-doped semiconductor region has a maximum doping concentration of less than about $10^{15}$ cm$^{-3}$.

18. The charge-compensation semiconductor device of claim 14, wherein the interface is formed at a horizontal position where a voltage at the first surface is at least about a fifth of a rated breakdown voltage of the charge-compensation semiconductor device when the rated breakdown voltage is applied between the source metallization and the drain metallization.

19. A method for manufacturing a charge-compensation semiconductor device, the method comprising:
  providing a semiconductor body comprising a first surface, a second surface arranged opposite to the first surface, a drain region of a first conductivity type extending to the second surface, an active area, and a peripheral area surrounding the active area;
in a vertical cross-section substantially orthogonal to the first surface the semiconductor body comprising:
  a low-doped semiconductor region arranged in the peripheral area and having a first concentration of dopants; and
  a plurality of first pillar regions alternating with second pillar regions in the active area and in the peripheral area, the first pillar regions having a second concentration of dopants of a first conductivity type higher than the first concentration of dopants, between adjoining first pillar regions and second pillar regions a respective pn-junction being formed, at least one of an outermost of the first pillar regions and an outermost of the second pillar regions forming an interface with the low-doped semiconductor region; and
  a connecting region of the second conductivity type arranged in the peripheral area and adjoining at least a majority of the second pillar regions of the peripheral area,
the method further comprising:
  forming in the peripheral area an equipotential structure at least next to the first surface;
  forming a source metallization on the first surface in Ohmic contact with the second pillar regions of the active area and with the connecting region;
  forming a drain metallization opposite to the source metallization and in Ohmic contact with the equipotential structure and the first pillar regions; and
  cutting the semiconductor body to form an edge extending between the first surface and the second surface and surrounding the active area,
such that a horizontal distance between the interface and the equipotential structure divided by a vertical distance between the first surface and the drain region is in a range from about 0.5 to about 3.

20. The method of claim 19, wherein providing the semiconductor body comprises at least one of:
  defining the active area;
  defining an outer portion of the peripheral area and an inner portion of the peripheral area, the inner portion being arranged between the active area and the outer portion, such that an outer boundary of the outer portion is substantially rectangular and that a boundary between the inner portion and the outer portion of the peripheral area is next to a corner of the outer boundary substantially parallel to a line segment of the outer boundary or forms an angle of about 60°, about 45° or about 30° with the line segment when seen form above;
  forming the first pillar regions using a first mask comprising first openings extending, in a first horizontal direction, from the active area into the inner portion; and forming the second pillar regions using a second mask comprising second openings extending, in the first horizontal direction, from the active area into the inner portion, wherein a horizontal extension of the first openings in a second horizontal direction substantially orthogonal to the first horizontal direction is larger in the active area compared to the inner portion, and/or wherein a horizontal extension in the second horizontal direction of the second openings is larger in the active area compared to the inner portion; and
  forming the first pillar regions with a reduced doping concentration in the inner portion of the peripheral area compared to the active area and forming the second pillar regions with a reduced doping concentration in the inner portion of the peripheral area compared to the active area such that the first pillar regions and the second pillar regions are substantially parallel to each other and that a boundary between the inner portion and the outer portion of the peripheral area is, in a corner region where two vertical sides of the edge approach, substantially parallel to one of the two vertical sides or forms an angle of about 60°, 45° or 30° with the edge.

\* \* \* \* \*

UNITED STATES PATENT AND TRADEMARK OFFICE
CERTIFICATE OF CORRECTION

| | |
|---|---|
| PATENT NO. | : 9,281,392 B2 |
| APPLICATION NO. | : 14/316987 |
| DATED | : March 8, 2016 |
| INVENTOR(S) | : J. Weyers et al. |

It is certified that error appears in the above-identified patent and that said Letters Patent is hereby corrected as shown below:

On the title page, item (57) Abstract (line 5), please change "of a of a" to -- of a --

In the claims,

Column 24, line 32 (claim 20 line 13), please change "seen form above;" to -- seen from above; --

Signed and Sealed this
Twenty-first Day of June, 2016

Michelle K. Lee
*Director of the United States Patent and Trademark Office*